US009899230B2

(12) United States Patent
Buckalew et al.

(10) Patent No.: US 9,899,230 B2
(45) Date of Patent: Feb. 20, 2018

(54) APPARATUS FOR ADVANCED PACKAGING APPLICATIONS

(71) Applicant: Novellus Systems, Inc., Fremont, CA (US)

(72) Inventors: Bryan L. Buckalew, Tualatin, OR (US); Steven T. Mayer, Aurora, OR (US); David Porter, Sherwood, OR (US); Thomas A. Ponnuswamy, Sherwood, OR (US)

(73) Assignee: Novellus Systems, Inc., Fremont, CA (US)

( * ) Notice: Subject to any disclaimer, the term of this patent is extended or adjusted under 35 U.S.C. 154(b) by 0 days.

(21) Appl. No.: 15/231,623

(22) Filed: Aug. 8, 2016

(65) Prior Publication Data

US 2016/0343582 A1    Nov. 24, 2016

Related U.S. Application Data

(62) Division of application No. 13/904,283, filed on May 29, 2013, now Pat. No. 9,449,808.

(51) Int. Cl.
*B44C 1/22* (2006.01)
*H01L 21/311* (2006.01)
(Continued)

(52) U.S. Cl.
CPC .......... *H01L 21/31133* (2013.01); *G03F 7/42* (2013.01); *G03F 7/425* (2013.01);
(Continued)

(58) Field of Classification Search
CPC .. C25D 5/022; C25D 7/12; G03F 7/42; G03F 7/425; H01L 21/02052; H01L 21/30604;
(Continued)

(56) References Cited

U.S. PATENT DOCUMENTS 3,652,442 A    3/1972 Powers et al.
3,706,651 A    12/1972 Leland
(Continued)

FOREIGN PATENT DOCUMENTS

CN    101220500 A    7/2008
CN    101736376 A    6/2010
(Continued)

OTHER PUBLICATIONS

U.S. Appl. No. 14/924,124, filed Oct. 27, 2015, entitled "Edge Flow Element for Electroplating Apparatus,".
(Continued)

*Primary Examiner* — Lan Vinh
(74) *Attorney, Agent, or Firm* — Weaver Austin Villeneuve & Sampson LLP

(57) ABSTRACT

The embodiments disclosed herein pertain to novel methods and apparatus for removing material from a substrate. In certain embodiments, the method and apparatus are used to remove negative photoresist, though the disclosed techniques may be implemented to remove a variety of materials. In practicing the disclosed embodiments, a stripping solution may be introduced from an inlet to an internal manifold, sometimes referred to as a cross flow manifold. The solution flows laterally through a relatively narrow cavity between the substrate and the base plate. Fluid exits the narrow cavity at an outlet, which is positioned on the other side of the substrate, opposite the inlet and internal manifold. The substrate spins while in contact with the stripping solution to achieve a more uniform flow over the face of the substrate. In some embodiments, the base plate includes protuberances which operate to increase the flow rate (and thereby increase the local Re) near the face of the substrate.

16 Claims, 16 Drawing Sheets

(51) Int. Cl.
*H01L 21/02* (2006.01)
*H01L 21/306* (2006.01)
*H01L 21/67* (2006.01)
*G03F 7/42* (2006.01)
*C25D 5/02* (2006.01)
*C25D 7/12* (2006.01)
*H01L 21/683* (2006.01)

(52) U.S. Cl.
CPC ........ *G03F 7/426* (2013.01); *H01L 21/02052* (2013.01); *H01L 21/30604* (2013.01); *H01L 21/6708* (2013.01); *C25D 5/022* (2013.01); *C25D 7/12* (2013.01); *H01L 21/6838* (2013.01)

(58) Field of Classification Search
CPC ........... H01L 21/31133; H01L 21/6708; H01L 21/6838
USPC ............... 134/33, 34; 216/88, 90, 92, 89; 156/345.14, 345.17, 345.21
See application file for complete search history.

(56) References Cited

U.S. PATENT DOCUMENTS

| | | | |
|---|---|---|---|
| 3,862,891 A | 1/1975 | Smith | |
| 4,033,833 A | 7/1977 | Bestel et al. | |
| 4,082,638 A | 4/1978 | Jumer | |
| 4,240,886 A | 12/1980 | Hodges et al. | |
| 4,272,335 A | 6/1981 | Combs | |
| 4,304,641 A | 12/1981 | Grandia et al. | |
| 4,427,520 A | 1/1984 | Bahnsen et al. | |
| 4,469,564 A | 9/1984 | Okinaka et al. | |
| 4,545,877 A | 10/1985 | Hillis | |
| 4,604,177 A | 8/1986 | Sivilotti | |
| 4,604,178 A | 8/1986 | Flegener et al. | |
| 4,605,482 A | 8/1986 | Shirgami et al. | |
| 4,633,893 A | 1/1987 | McConnell | |
| 4,696,729 A | 9/1987 | Santini | |
| 4,738,272 A | 4/1988 | McConnell | |
| 4,828,654 A | 5/1989 | Reed | |
| 4,856,544 A | 8/1989 | McConnell | |
| 4,906,346 A | 3/1990 | Hadersbeck et al. | |
| 4,931,149 A | 6/1990 | Stierman et al. | |
| 4,933,061 A | 6/1990 | Kulkami et al. | |
| 5,039,381 A | 8/1991 | Mullarkey | |
| 5,078,852 A | 1/1992 | Yee et al. | |
| 5,096,550 A | 3/1992 | Mayer et al. | |
| 5,146,136 A | 9/1992 | Ogura et al. | |
| 5,156,730 A | 10/1992 | Bhatt et al. | |
| 5,162,079 A | 11/1992 | Brown | |
| 5,217,586 A | 6/1993 | Datta et al. | |
| 5,316,642 A | 5/1994 | Young, Jr. et al. | |
| 5,368,711 A | 11/1994 | Poris | |
| 5,391,285 A | 2/1995 | Lytle et al. | |
| 5,421,987 A | 6/1995 | Tzanavaras et al. | |
| 5,443,707 A | 8/1995 | Mori | |
| 5,472,592 A | 12/1995 | Lowery | |
| 5,476,578 A | 12/1995 | Forand | |
| 5,498,325 A | 3/1996 | Nishimura et al. | |
| 5,516,412 A | 5/1996 | Andricacos et al. | |
| 5,567,300 A | 10/1996 | Datta et al. | |
| 5,660,699 A | 8/1997 | Saito et al. | |
| 5,723,028 A | 3/1998 | Poris | |
| 5,744,019 A | 4/1998 | Ang | |
| 5,935,402 A | 8/1999 | Fanti | |
| 6,004,440 A | 12/1999 | Hanson et al. | |
| 6,027,631 A | 2/2000 | Broadbent | |
| 6,080,291 A | 6/2000 | Woodruff et al. | |
| 6,106,687 A | 8/2000 | Edelstein | |
| 6,126,798 A | 10/2000 | Reid et al. | |
| 6,132,587 A | 10/2000 | Jorne et al. | |
| 6,132,805 A | 10/2000 | Moslehi | |
| 6,179,983 B1 | 1/2001 | Reid et al. | |
| 6,193,860 B1 | 2/2001 | Weling | |
| 6,228,231 B1 | 5/2001 | Uzoh | |
| 6,251,255 B1 | 6/2001 | Copping et al. | |
| 6,254,742 B1 | 7/2001 | Hanson et al. | |
| 6,261,433 B1 | 7/2001 | Landau | |
| 6,368,475 B1 | 4/2002 | Hanson et al. | |
| 6,391,166 B1 | 5/2002 | Wang | |
| 6,391,188 B1 | 5/2002 | Goosey | |
| 6,395,152 B1 | 5/2002 | Wang | |
| 6,398,926 B1 | 6/2002 | Mahneke | |
| 6,402,923 B1 | 6/2002 | Mayer et al. | |
| 6,431,908 B1 | 8/2002 | Beck et al. | |
| 6,454,918 B1 | 9/2002 | Sakaki | |
| 6,497,801 B1 | 12/2002 | Woodruff et al. | |
| 6,514,570 B1 * | 2/2003 | Matsuyama | H01L 21/6715 118/300 |
| 6,521,102 B1 | 2/2003 | Dordi | |
| 6,527,920 B1 | 3/2003 | Jackson et al. | |
| 6,551,483 B1 | 4/2003 | Mayer et al. | |
| 6,627,051 B2 | 9/2003 | Berner et al. | |
| 6,632,335 B2 | 10/2003 | Kunisawa et al. | |
| 6,755,954 B2 | 6/2004 | Mayer et al. | |
| 6,773,571 B1 | 8/2004 | Mayer et al. | |
| 6,800,187 B1 | 10/2004 | Reid et al. | |
| 6,821,407 B1 | 11/2004 | Reid et al. | |
| 6,843,855 B2 | 1/2005 | Verhaverbeke | |
| 6,869,515 B2 | 3/2005 | Cohen | |
| 6,890,416 B1 | 5/2005 | Mayer et al. | |
| 6,919,010 B1 | 7/2005 | Mayer et al. | |
| 6,921,468 B2 | 7/2005 | Graham et al. | |
| 6,964,792 B1 | 11/2005 | Mayer et al. | |
| 7,070,686 B2 | 7/2006 | Contolini et al. | |
| 7,169,705 B2 | 1/2007 | Ide et al. | |
| D544,452 S | 6/2007 | Nakamura et al. | |
| D548,705 S | 8/2007 | Hayashi | |
| D552,565 S | 10/2007 | Nakamura et al. | |
| D553,104 S | 10/2007 | Oohashi et al. | |
| 7,387,131 B2 * | 6/2008 | Kuroda | H01L 21/67051 118/313 |
| D587,222 S | 2/2009 | Sasaki et al. | |
| 7,622,024 B1 | 11/2009 | Mayer et al. | |
| 7,641,776 B2 | 1/2010 | Nagar et al. | |
| D609,652 S | 2/2010 | Nagasaka et al. | |
| D609,655 S | 2/2010 | Sugimoto | |
| 7,670,465 B2 | 3/2010 | Yang et al. | |
| D614,593 S | 4/2010 | Lee et al. | |
| 7,837,841 B2 | 11/2010 | Chen et al. | |
| 7,854,828 B2 | 12/2010 | Reid et al. | |
| 7,935,240 B2 | 5/2011 | Singh et al. | |
| 7,967,969 B2 | 6/2011 | Mayer et al. | |
| D648,289 S | 11/2011 | Mayer et al. | |
| 8,308,931 B2 | 11/2012 | Reid et al. | |
| 8,795,480 B2 | 8/2014 | Mayer et al. | |
| 9,394,620 B2 | 7/2016 | Mayer et al. | |
| 9,449,808 B2 | 9/2016 | Buckalew et al. | |
| 9,464,361 B2 | 10/2016 | Mayer et al. | |
| 9,523,155 B2 | 12/2016 | Mayer et al. | |
| 9,624,592 B2 | 4/2017 | Abraham et al. | |
| 9,834,852 B2 | 12/2017 | Mayer et al. | |
| 2002/0017456 A1 | 2/2002 | Graham et al. | |
| 2002/0062839 A1 | 5/2002 | Verhaverbeke et al. | |
| 2002/0066464 A1 | 6/2002 | Bergman | |
| 2002/0084189 A1 | 7/2002 | Wang et al. | |
| 2002/0119671 A1 | 8/2002 | Lee | |
| 2002/0125141 A1 | 9/2002 | Wilson et al. | |
| 2002/0164840 A1 | 11/2002 | Lu et al. | |
| 2002/0166773 A1 | 11/2002 | Cohen | |
| 2003/0017647 A1 | 1/2003 | Kwon et al. | |
| 2003/0019755 A1 | 1/2003 | Hey et al. | |
| 2003/0029527 A1 | 2/2003 | Yajima et al. | |
| 2003/0038035 A1 | 2/2003 | Wilson et al. | |
| 2003/0102210 A1 | 6/2003 | Woodruff et al. | |
| 2003/0201166 A1 | 10/2003 | Zheng et al. | |
| 2004/0000487 A1 | 1/2004 | Bonkass et al. | |
| 2004/0053147 A1 * | 3/2004 | Ito | G03F 7/3021 430/30 |
| 2004/0118694 A1 | 6/2004 | Yang et al. | |
| 2004/0149584 A1 | 8/2004 | Nagai et al. | |
| 2004/0168926 A1 | 9/2004 | Basol et al. | |

(56) References Cited

U.S. PATENT DOCUMENTS

| | | | |
|---|---|---|---|
| 2004/0231989 A1 | 11/2004 | Kobata et al. | |
| 2004/0256238 A1 | 12/2004 | Suzuki et al. | |
| 2005/0003737 A1 | 1/2005 | Montierth et al. | |
| 2005/0045488 A1 | 3/2005 | Paneccasio et al. | |
| 2005/0053874 A1* | 3/2005 | Yoshihara | G03D 3/06 430/434 |
| 2005/0145482 A1 | 7/2005 | Suzuki et al. | |
| 2005/0145499 A1 | 7/2005 | Kovarsky et al. | |
| 2005/0161336 A1 | 7/2005 | Woodruff et al. | |
| 2005/0181252 A1 | 8/2005 | Risen et al. | |
| 2006/0038182 A1* | 2/2006 | Rogers | B82Y 10/00 257/77 |
| 2006/0054181 A1 | 3/2006 | Rayandayan et al. | |
| 2006/0243598 A1 | 11/2006 | Singh et al. | |
| 2007/0015080 A1 | 1/2007 | Toukhy et al. | |
| 2007/0029193 A1 | 2/2007 | Brcka | |
| 2007/0068819 A1 | 3/2007 | Singh et al. | |
| 2010/0032304 A1 | 2/2010 | Mayer et al. | |
| 2010/0032310 A1 | 2/2010 | Reid et al. | |
| 2010/0035192 A1* | 2/2010 | Ando | G03F 7/2022 430/325 |
| 2010/0044236 A1 | 2/2010 | Mayer et al. | |
| 2010/0116672 A1 | 5/2010 | Mayer et al. | |
| 2010/0243462 A1 | 9/2010 | Cohen | |
| 2011/0031112 A1 | 2/2011 | Birang et al. | |
| 2012/0000786 A1 | 1/2012 | Mayer et al. | |
| 2012/0261254 A1 | 10/2012 | Reid et al. | |
| 2013/0313123 A1 | 11/2013 | Abraham et al. | |
| 2014/0183049 A1 | 7/2014 | Mayer et al. | |
| 2014/0299477 A1 | 10/2014 | Mayer et al. | |
| 2014/0299478 A1 | 10/2014 | Mayer et al. | |
| 2014/0357089 A1 | 12/2014 | Buckalew et al. | |
| 2016/0265132 A1 | 9/2016 | Graham et al. | |
| 2016/0343582 A1 | 11/2016 | Buckalew et al. | |
| 2016/0376722 A1 | 12/2016 | Mayer et al. | |
| 2017/0029973 A1 | 2/2017 | Mayer et al. | |
| 2017/0058417 A1 | 3/2017 | Graham et al. | |
| 2017/0175286 A1 | 6/2017 | Abraham et al. | |
| 2017/0342583 A1 | 11/2017 | Thorkelsson et al. | |
| 2017/0342590 A1 | 11/2017 | Thorkelsson et al. | |

FOREIGN PATENT DOCUMENTS

| | | |
|---|---|---|
| CN | 102330140 A | 1/2012 |
| CN | 201130081716.6 | 4/2012 |
| CN | 102459717 A | 5/2012 |
| CN | 102732924 A | 10/2012 |
| EP | 0 037 325 | 3/1981 |
| EP | 0 233 184 | 8/1987 |
| EP | 1 538 662 | 6/2005 |
| GB | 2 176 908 | 1/1987 |
| GB | 2 206 733 | 1/1989 |
| JP | 59-162298 | 9/1984 |
| JP | 09-53197 | 2/1997 |
| JP | 2001-064795 A | 3/2001 |
| JP | 2001-316887 | 11/2001 |
| JP | 2002-289568 | 10/2002 |
| JP | 2003-268591 | 9/2003 |
| JP | 2005-344133 A | 12/2005 |
| KR | 10-0707121 | 4/2007 |
| KR | 0657600 | 8/2012 |
| TW | 200302519 | 8/2003 |
| TW | 591122 B | 6/2004 |
| TW | 201204877 A1 | 2/2012 |
| TW | D148167 | 7/2012 |
| WO | WO 87/00094 | 1/1987 |
| WO | WO 1999/041434 | 8/1999 |
| WO | WO 02/01609 | 1/2002 |
| WO | WO 2004/114372 | 12/2004 |
| WO | WO 2007/128659 | 11/2007 |
| WO | WO 2010/144330 | 12/2010 |

OTHER PUBLICATIONS

U.S. Appl. No. 15/161,081, filed May 20, 2016, entitled Dynamic Modulation of Cross Flow Manifold During Electroplating, Graham et al.

U.S. Appl. No. 15/225,716, filed Aug. 1, 2016, entitled "Dynamic Modulation of Cross Flow Manifold During Elecroplating", Thorkelsson et al.

U.S. Appl. No. 13/110,759, filed May 18, 2011, entitled "High Resistance Ionic Current Source", Mayer et al.

U.S. Office Action dated Oct. 26, 2007 issued in U.S. Appl. No. 11/040,359.

U.S. Final Office Action dated Jul. 25, 2008 issued in U.S. Appl. No. 11/040,359.

U.S. Office Action dated Jan. 8, 2009 issued in U.S. Appl. No. 11/040,359.

U.S. Notice of Allowance dated Jul. 20, 2009 issued in U.S. Appl. No. 11/040,359.

U.S. Office Action dated Oct. 6, 2010 issued in U.S. Appl. No. 12/578,310.

U.S. Notice of Allowance dated Mar. 4, 2011 issued in U.S. Appl. No. 12/578,310.

U.S. Office Action dated Oct. 5, 2012 issued in U.S. Appl. No. 13/110,759.

U.S. Office Action dated Sep. 19, 2011 issued in U.S. Appl. No. 12/291,356.

U.S. Final Office Action dated Feb. 27, 2012 issued inU.S. Appl. No. 12/291,356.

U.S. Notice of Allowance dated Jul. 27, 2012 issued in U.S. Appl. No. 12/291,356.

U.S. Office Action dated Jun. 24, 2011 issued in U.S. Appl. No. 12/481,503.

U.S. Final Office Action dated Mar. 1, 2012 issued in U.S. Appl. No. 12/481,503.

U.S. Office Action dated Jul. 9, 2012 issued in U.S. Appl. No. 12/481,503.

U.S. Final Office Action dated Dec. 19, 2012 issued in U.S. Appl. No. 12/481,503.

U.S. Office Action dated Jun. 24, 2011 issued in U.S. Appl. No. 12/606,030.

U.S. Final Office Action dated Mar. 1, 2012 issued in U.S. Appl. No. 12/606,030.

U.S. Office Action dated Jul. 13, 2012 issued in U.S. Appl. No. 12/606,030.

U.S. Final Office Action dated Dec. 17, 2012 issued in U.S. Appl. No. 12/606,030.

U.S. Notice of Allowance dated Aug. 10, 2011 issued in Design U.S. Appl. No. 29/377,521.

U.S. Office Action dated Jun. 26, 2013 issued in U.S. Appl. No. 13/172,642.

U.S. Final Office Action dated Jan. 15, 2014 issued in U.S. Appl. No. 13/172,642.

U.S. Notice of Allowance dated Mar. 27, 2014 issued in U.S. Appl. No. 13/172,642.

U.S. Office Action dated Jan. 14, 2016 issued in U.S. Appl. No. 14/309,723.

U.S. Notice of Allowance dated Jun. 9, 2016 issued in U.S. Appl. No. 14/309,723.

U.S. Office Action dated Nov. 2, 2015 issued in U.S. Appl. No. 13/893,242.

U.S. Office Action dated May 18, 2016 issued in U.S. Appl. No. 13/893,242.

U.S. Office Action dated Aug. 18, 2015 issued in U.S. Appl. No. 14/308,258.

U.S. Notice of Allowance dated Jan. 12, 2016 issued in U.S. Appl. No. 14/308,258.

U.S. Office Action dated Feb. 1, 2016 issued in U.S. Appl. No. 14/103,395.

U.S. Notice of Allowance dated Jul. 15, 2016 issued in U.S. Appl. No. 14/103,395.

U.S. Office Action dated Oct. 15, 2014 issued in U.S. Appl. No. 13/904,283.

U.S. Notice of Allowance dated May 5, 2015 issued in U.S. Appl. No. 13/904,283.

(56) References Cited

OTHER PUBLICATIONS

U.S. Notice of Allowance dated Feb. 1, 2016 issued in U.S. Appl. No. 13/904,283.
U.S. Notice of Allowance dated Aug. 2, 2016 issued in U.S. Appl. No. 13/904,283.
PCT International Search Report and Written Opinion dated Jan. 12, 2011 issued in Application No. PCT/US2010/037520.
Chinese Office Action dated Jul. 19, 2011 issued in Application No. CN 201130081716.6.
Taiwan Office Action dated Nov. 28, 2011 issued in Application No. TW 100301923.
Korean Office Action dated Apr. 20, 2012 issued in Application No. KR 20110012881.
Chinese First Office Action dated Jan. 20, 2015 issued in Application No. CN 201110192296.8.
Chinese Second Office Action [no translation] dated Sep. 23, 2015 issued in Application No. CN 201110192296.8.
Chinese Third Office Action dated Jan. 15, 2016 issued in Application No. CN 201110192296.8.
Chinese Fourth Office Action dated May 5, 2016 issued in Application No. CN 201110192296.8.
Taiwan Office Action dated Apr. 8, 2015 issued in Application No. TW 100123415.
Taiwan Office Action and Search Report dated Mar. 4, 2016 issued in Application No. TW 104127539.
Austrian Office Action dated Aug. 14, 2014 issued in A50817/2013.
Austrian Search Report dated Dec. 5, 2014 issued in A50817/2013.
Chinese First Office Action dated Nov. 26, 2015 issued in CN 201310683415.9.
*Electrochemical Methods: Fundamentals and Applications*, Bard & Faulkner eds. Chapter 8, Dec. 2000, pp. 280-292.
Fang et al. (2004) "Uniform Copper Electroplating on Resistive Substrates," Abs. 167, 205th Meeting, The Electrochemical Society, Inc., 1 page.
Lowenheim, (1978) "Electroplating," *Sponsored by the American Electroplaters' Society*, McGraw-Hill Book Company, New York, p. 139.
Malmstadt et al., (1994) "Microcomputers and Electronic Instrumentation: Making the Right Connections," American Chemical Society, p. 255.
"Release of Sabre™ electrofill tool with HRVA by Novellus Systems, Inc." dated prior to the filed of the instant application (3 pages).
Schwartz, Daniel T. et al., (1987) "Mass-Transfer Studies in a Plating Cell with a Reciprocating Paddle," *Journal of the Electrochemical Society*, 134(7):1639-1645.
Wilson, Gregory J. et al., (2005) "Unsteady Numerical Simulation of the Mass Transfer within a Reciprocating Paddle Electroplating Cell," *Journal of The Electrochemical Society*, 152(6):C356-C365.
U.S. Notice of Allowability dated Sep. 13, 2016 issued in U.S. Appl. No. 14/309,723.
U.S. Notice of Allowance dated Dec. 8, 2016 issued in U.S. Appl. No. 13/893,242.
U.S. Notice of Allowance (Corrected Notice of Allowability) dated Aug. 24, 2016 issued in U.S. Appl. No. 14/103,395.
U.S. Notice of Allowance (Corrected Notice of Allowability) dated Nov. 16, 2016 issued in U.S. Appl. No. 14/103,395.
U.S. Office Action dated Apr. 6, 2017 issued in U.S. Appl. No. 15/291,543.
U.S. Notice of Allowance dated Jul. 28, 2017 issued in U.S. Appl. No. 15/291,543.
Korean Office Action dated Mar. 14, 2017 issued in Application No. KR 10-2011-0066023.
Korean Office Action dated Aug. 11, 2017 issued in Application No. KR 10-2017-0060181.
Taiwan Office Action and Search Report dated Aug. 5, 2016 issued in Application No. TW 102117113.
Chinese Second Office Action dated Aug. 3, 2016 issued in CN 201310683415.9.
Taiwan Examination and Search Report dated Apr. 14, 2017 issued in TW 102145866.
Akire et al., (Nov. 1982) "High-Speed Selective Electroplating with Single Circular Jets," J. Electrochem. Soc.: Electrochemical Science and Technology, 129(11):2424-2432.
U.S. Appl. No. 15/413,252, filed Jan. 23, 2017, Thorkelsson et al.
U.S. Appl. No. 15/448,472, filed Mar. 2, 2017, Abraham et al.
U.S. Appl. No. 15/455,011, filed Mar. 9, 2017, Graham et al.
Taiwan Notice of Allowance and Search Report dated Oct. 31, 2017 issued in Application No. TW 103118470.
U.S. Appl. No. 15/707,805, filed Sep. 18, 2017, Banik et al.
U.S. Appl. No. 15/799,903, filed Oct. 31, 2017, Mayer et al.
U.S. Appl. No. 15/846,029, filed Dec. 18, 2017, Buckalew et al.

\* cited by examiner

*Step 105*

*Step 125*

*Step 110*

*Step 130*

*Step 115*

*Step 135*

*Step 120*

APPARATUS FOR ADVANCED PACKAGING APPLICATIONS

CROSS-REFERENCE TO RELATED APPLICATION

This application is a divisional of U.S. application Ser. No. 13/904,283, titled "APPARATUS FOR ADVANCED PACKAGING APPLICATIONS," filed May 29, 2013, all of which is incorporated herein by this reference and for all purposes.

BACKGROUND

Photoresist is a light sensitive material used in certain fabrication processes to form a patterned coating on a work piece, e.g., a semiconductor wafer, during processing. After exposing the photoresist coated surface to a pattern of high energy radiation, a portion of the photoresist is removed to reveal the surface below, leaving the rest of the surface protected. Semiconductor processes such as deposition, etching, and other processes may then be performed on the partially uncovered surface and remaining photoresist. After performing one or more semiconductor processes, the remaining photoresist can be removed in a strip operation.

Both negative and positive photoresists may be used to pattern a wafer. With positive photoresist, exposure to the high energy radiation causes the resist material to become more soluble in the developer, as compared to parts of the resist that are not exposed to the radiation. As such, when a substrate patterned with positive photoresist is exposed to developer, the areas where the resist was exposed to radiation are removed, while the resist in non-exposed areas remains intact. Negative photoresists work in the opposite manner, in that exposure of a negative photoresist to high energy radiation causes the negative photoresist material to become less soluble in developer. Therefore, after contact with the developer, the areas of the negative resist that were exposed to radiation remain intact, while areas of the resist that were not exposed are removed.

One area in which negative photoresists have been adopted for use is in Wafer Level Packaging (WLP) processes such as in bump and copper pillar applications. For example, these processes may utilize certain negative dry film and spin-on photoresists. These materials have proven especially advantageous in these applications because they have good adhesion to substrates, excellent compatibility with plating chemistries, and result in well-formed, vertical profiles with essentially no footing at the feature base, even for deep features (e.g., features deeper than about 20 μm). Negative photoresists present certain fabrication problems, however. One main issue with the use of these materials is that negative photoresists are quite difficult to remove.

SUMMARY

Certain embodiments herein relate to methods and apparatus for removing material from a substrate. In some cases, the material removed is a negative photoresist material, and the substrate is a partially fabricated semiconductor substrate, though the embodiments are not so limited.

In one aspect of the embodiments herein, a method is provided for removing material from a substrate. The method includes (a) receiving a substrate having material for removal thereon; (b) positioning and sealing the substrate in a substrate holder such that the material for removal is exposed; (c) positioning the substrate holder in a removal position, thereby forming a cavity defined on one side by the substrate, defined on the opposite side by a base plate, and defined around the edges by a flow distributor, where the cavity has a dimension between about 2-10 mm as measured in a direction perpendicular to a face of the substrate, and where the flow distributor includes (i) an internal manifold spanning between about 90-180° around the flow distributor, where the internal manifold is a cavity in the flow distributor through which fluid may flow, and (ii) one or more inlets for delivering fluid from one or more fluid supply lines to the internal manifold and (iii) an outlet manifold spanning between about 90-180° around the flow distributor, and positioned opposite the internal manifold; (d) rotating the substrate in the substrate holder; and (e) flowing stripping solution from the one or more inlets, through the internal manifold, into the cavity over the face of the substrate, and out through the outlet manifold, to thereby remove from the substrate at least some of the material for removal.

In various embodiments, sealing the substrate in the substrate holder forms a fluid tight seal between the substrate and substrate holder. The method may also include positioning the substrate holder in an open position such that the substrate may be removed from the substrate holder, and removing the substrate. In some cases, the material for removal includes photoresist material. The photoresist material may be a negative photoresist material. In some implementations, the stripping solution is flowed at a rate between about 20-40 LPM. The stripping solution may include a DMSO- and/or TMAH-based solution in some cases. In various embodiments, the substrate to be treated has features thereon, and the features may have a principal dimension between about 5-120 μm. In some cases, the material for removal is completely removed. In other cases, it is substantially completely removed. In one implementation, the material for removal is substantially completely removed within about 4 minutes after beginning to flow stripping solution over the face of the substrate.

In another aspect of the embodiments herein, an apparatus for removing material from a substrate is provided. The apparatus may include a removal cell including (a) a substrate holder configured to hold and rotate a disc-shaped substrate in a substrate plane, (b) a base plate positioned substantially parallel to the substrate plane such that a cavity is formed between the base plate and the substrate when the substrate is present in the substrate holder, where the distance between the base plate and the substrate in the substrate holder is between about 2-10 mm, and (c) a flow distributor at least partially positioned between the baseplate and substrate holder, where the flow distributor includes (i) an internal manifold spanning between about 90-180° around the flow distributor, where the internal manifold is a cavity in the flow distributor through which fluid may flow, (ii) one or more inlets for delivering fluid from a fluid supply line to the internal manifold, and (iii) an outlet manifold spanning between about 90-180° around the flow distributor, and positioned opposite the internal manifold.

The apparatus may also include a plurality of fins positioned in the cavity that operate to direct fluid to flow in a substantially linear flow pattern from the internal manifold to the outlet manifold. Further, the apparatus may include a rinsing element designed or configured to deliver rinsing fluid to the surface of the substrate. In some cases the rinsing element may be designed or configured to be used in the removal cell. In other cases, the rinsing element may be positioned in a module that is separate from the removal cell, such as a spin rinse drying module. The substrate to be treated may have a diameter of 300 or 450 mm in certain cases. The internal manifold of the apparatus may include a plurality of showerhead outlet holes designed or configured to deliver fluid to the cavity. In some implementations, the showerhead outlet holes are positioned between the substrate holder and the base plate and radially outside of the peripheral edge of the substrate. The apparatus also may include a gap between the flow distributor and the substrate holder. In various cases, this gap is between about 0.25-8 mm. In some embodiments, the internal manifold includes a plurality of angularly distinct sections. In a particular implementation, the flow to at least one angularly distinct section of the internal manifold may be controlled independently of at least one other angularly distinct section of the internal manifold.

These and other features will be described below with reference to the associated drawings.

DETAILED DESCRIPTION

Figure 1A:
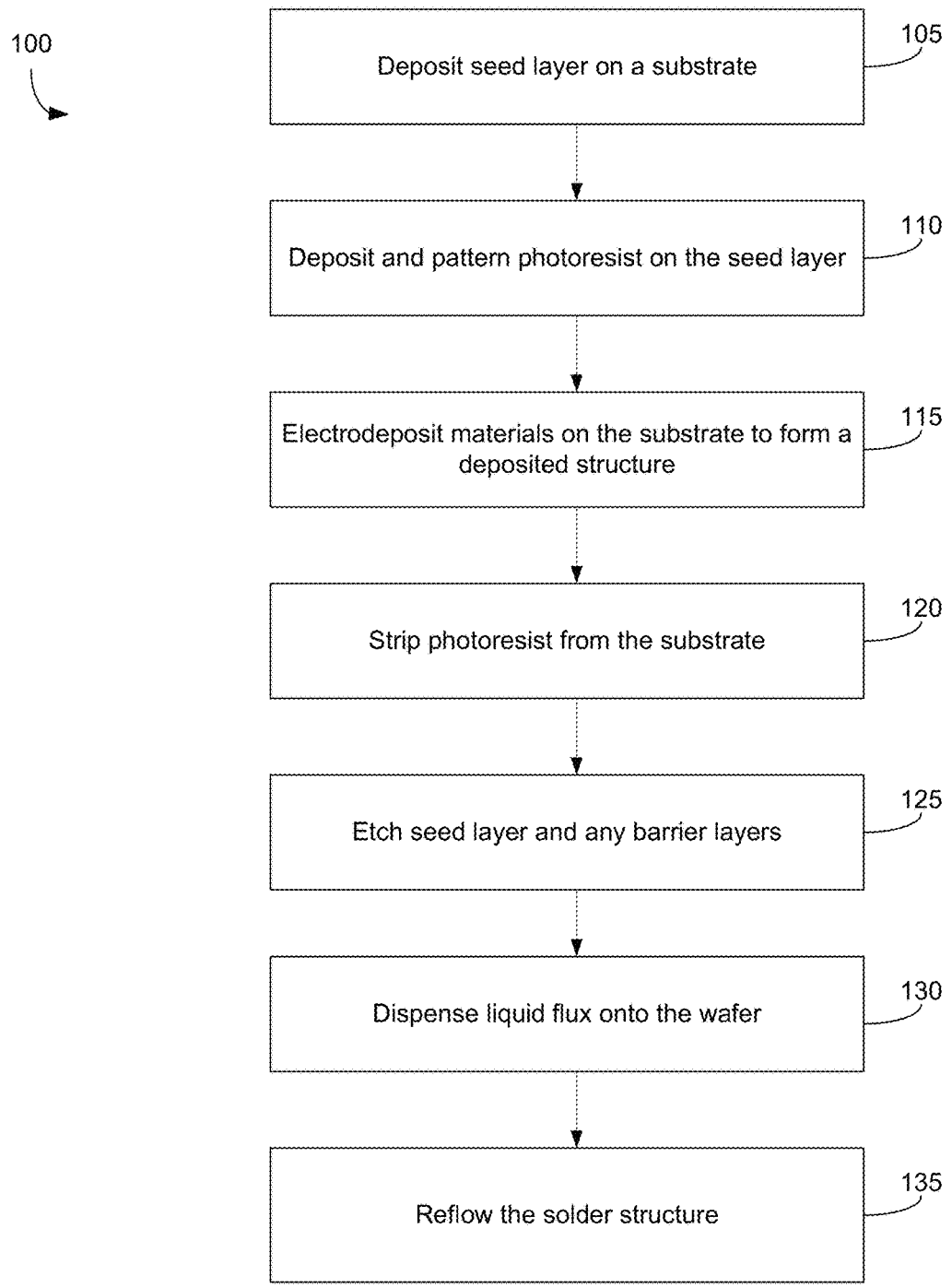
FIG. 1A is a flowchart showing various operations in a typical WLP process sequence.

In this application, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication thereon. A wafer or substrate used in the semiconductor device industry typically has a diameter of 200 mm, or 300 mm, or 450 mm. Further, the terms "photoresist" and "resist" are used interchangeably. The following detailed description assumes the invention is implemented on a wafer. However, the invention is not so limited. The work piece may be of various shapes, sizes, and materials. In addition to semiconductor wafers, other work pieces that may take advantage of this invention include various articles such as printed circuit boards and the like.

In the following description, numerous specific details are set forth in order to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Further, in the following discussion, when referring to top and bottom features or elements of the disclosed embodiments, the terms top and bottom are simply used for convenience and represent only a single frame of reference or implementation of the invention. Other configurations are possible, such as those in which the top and bottom components are reversed with respect to gravity and/or the top and bottom components become the left and right or right and left components. Similarly, the terms horizontal and vertical apply to the embodiments as described and shown in the figures, but it is to be understood that other orientations are possible.

The embodiments herein are often described in relation to removing negative photoresist, though the embodiments are not so limited and may be implemented in a variety of removal/cleaning processes. For example, the methods and apparatus described herein may be used to remove both negative and positive photoresist materials. Further, the disclosed techniques may be implemented to remove other, non-photoresist materials from substrates such as disc-shaped substrates, with the substitution of appropriate chemistries for removing the target material.

Conventional photoresist stripping methods were originally designed mainly to remove positive photoresist materials that readily dissolve in acetone. These conventional methods often employ soak tanks with $N_2$ bubbling or single-wafer spin systems. Negative resists are often removed with DMSO- or TMAH-based solutions, though other stripping solutions may be used as well. Unlike positive resists, negative resists do not readily dissolve in stripping solution. Instead, the negative resist tends to swell, lift (i.e., de-laminate), and then partially dissolve over a relatively long duration. In commercial applications, this dissolution happens over a period of roughly 5 minutes. For smaller scale laboratory-based applications, this dissolution happens over a period of roughly 30 minutes.

Certain feature types can exacerbate the difficulty of negative photoresist removal. For example, in SnAg mushroom plating, where SnAg material is plated to fill and then overfill a feature (thereby creating a mushroom shape), the SnAg overfill can pin a certain amount of photoresist material under the top portion of the mushroom-shaped deposit. This pinned in material is physically challenging to remove. Another example where the feature type affects photoresist removal is in the case of high pitch (densely packed) features such as bumps and pillars. These high pitch features make it difficult for stripping fluid to penetrate and circulate as needed to remove the photoresist. The embodiments herein may be used to remove photoresist and other materials, even where these difficult geometries are present. In some implementations, the substrate to be stripped includes features having a principal dimension between about 5-120 µm, for example 20-50 µm. In some implementations, the substrate to be stripped includes features having a pitch of at most about 250 µm, e.g., between about 5 µm and 100 µm. In one embodiment, the substrate to be stripped includes pillars or other structures that are approximately 20×20 µm with a 40 µm pitch. In another embodiment, the substrate includes approximately 80×120 µm plated bumps with an approximately 150 µm pitch.

The methods and apparatus disclosed herein provide new techniques for removing photoresist (and other) materials. The disclosed techniques provide for faster, more efficient, and more effective removal of negative photoresist.

Methods

Figure 1B:
FIG. 1B illustrates a substrate at the various stages described in FIG. 1A
Figure 1B:
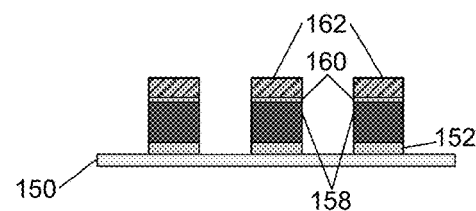
Figure 1B:
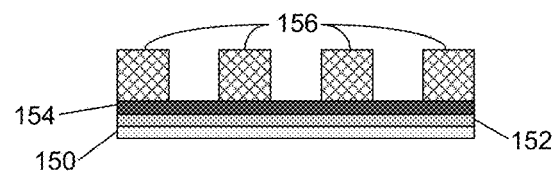
Figure 1B:
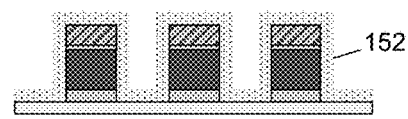
Figure 1B:
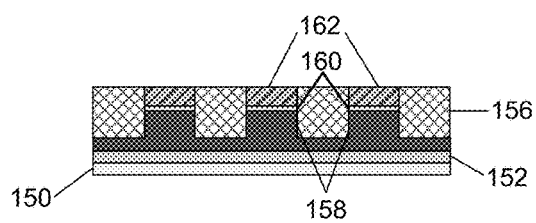
Figure 1B:
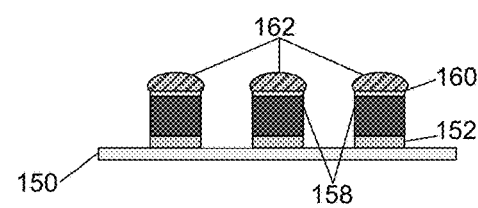
Figure 1B:
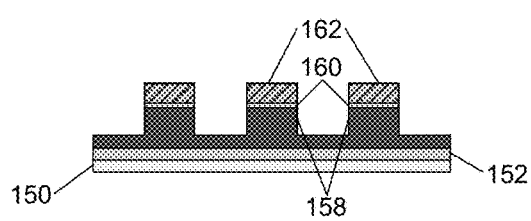
Figure 2:
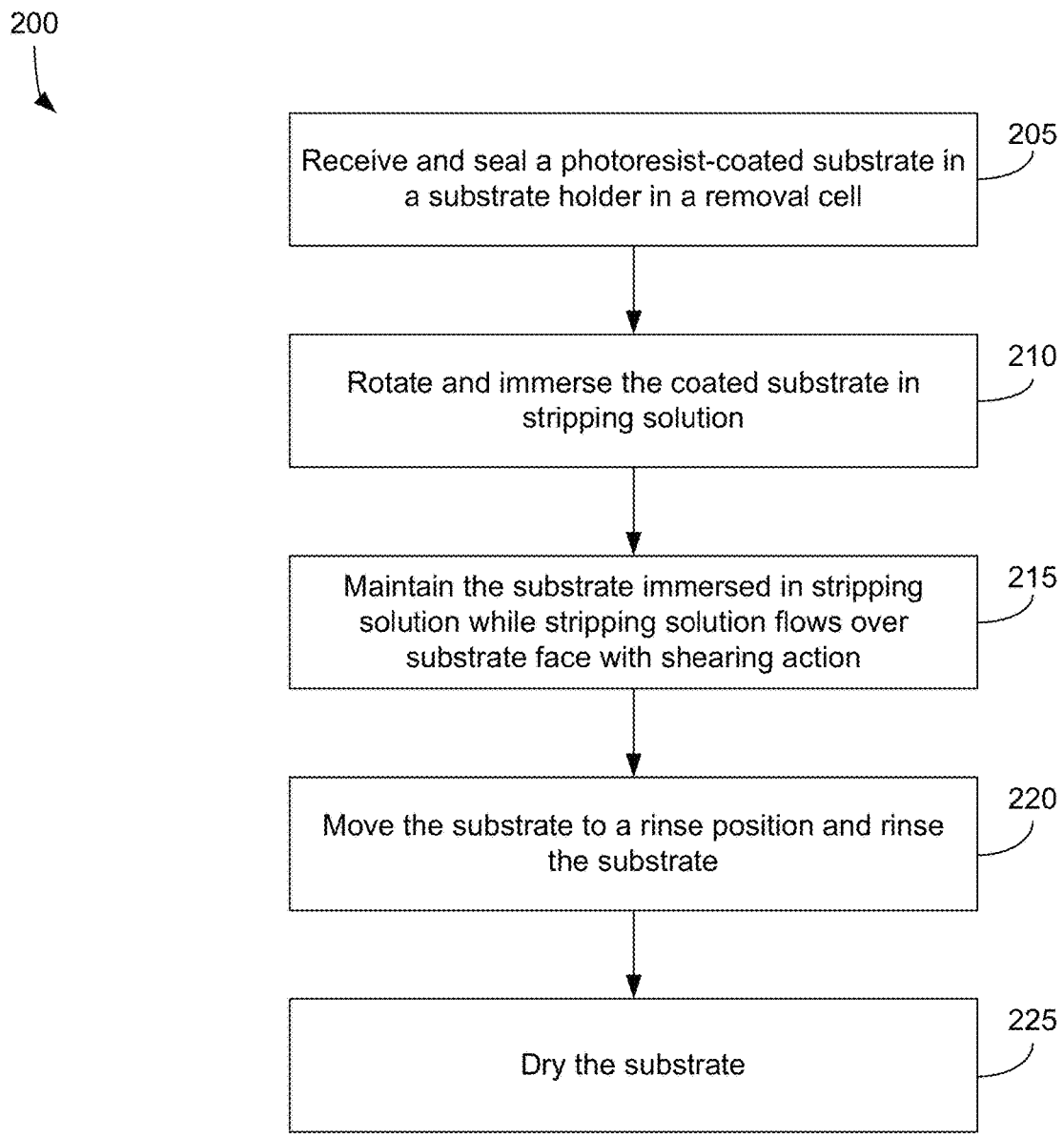
FIG. 2 shows a photoresist stripping operation in accordance with the embodiments herein.

FIGS. 1A-1B illustrate different operations undertaken in a typical WLP process sequence. In these figures, the photoresist stripping operation is treated at a very high level. FIG. 2 and the accompanying discussion describe the photoresist stripping operation in more detail.

FIG. 1A shows a flowchart for a typical WLP process sequence, and FIG. 1B shows simplified drawings of a partially fabricated semiconductor substrate at each stage described in FIG. 1A. The process 100 may be used for, e.g., forming a WLP structure containing a solder structure, such as a solder ball, and a copper containing structure, such as a copper RDL (redistribution layer) pad, copper pillar, or other similar structure. The solder ball may be formed from any suitable material such as a tin containing material such as tin-silver or tin-lead. Other WLP structures may contain nickel, gold, etc. Any of these materials may be deposited by electroplating on a substrate containing patterned photoresist. The copper containing structure may be configured to deliver current between one or more ports and one or more solder structures in an integrated circuit package. In certain embodiments, the thickness of the copper containing structure can be greater than about 1 nm, such as between about 5 nm and about 10 nm, or between about 10 nm and about 30 nm. The thickness is typically the distance between the substrate on which copper is plated and the surface of the plated copper which interfaces with the solder.

The process 100 begins at step 105, where a seed layer 154 (e.g., a copper seed layer) is deposited on a substrate 150. Deposition of the seed layer 154 in step 105 may occur by physical vapor deposition (PVD). In some embodiments, the seed layer 154 may be deposited on a barrier layer 152, such as a layer of tantalum (Ta) or tantalum nitride (TaN), or a bi-layer of TaN/Ta.

The process 100 continues at step 110, where photoresist 156 is deposited and patterned on the seed layer 154. In some embodiments, the photoresist 156 is deposited by any suitable technique, such as spin coating, and then patterned according to a desired copper RDL and/or solder bump layout. For example, the photoresist 156 can be patterned by selectively masking, exposing, developing, and etching the photoresist 156. Patterning may remove some or all of the barrier layer 152, if present, at ports on the substrate such as I/O ports on an integrated circuit (not shown).

The process 100 continues at step 115, where material is electrodeposited on the substrate to form the deposited structure. In certain implementations, the material deposited is copper, and the deposited structure is a copper-containing structure. In some embodiments, the copper can be plated on the substrate electrolytically by immersing the substrate in an electroplating bath and applying cathodic current to substrate. Alternatively or subsequently, a solder bump may be electroplated in the regions of the substrate where the photoresist has been removed. In some cases, the solder bump is formed from tin and silver. Where the material being deposited is copper, the electroplating bath can contain positive ions of copper and associated anions in an acid solution. The source of copper ions may be copper sulfate ($CuSO_4$), copper methane sulfonate ($Cu(CH_3SO_3)_2$), copper gluconate ($C_{12}H_{22}CuO_{14}$), copper sulfamate, copper nitrate, copper phosphate, copper chloride and others. In particular implementations, the electroplating bath may contain between about 10 g/L and about 200 g/L of sulfuric acid, and between about 10 g/L and about 80 g/L of copper ions. For example, the electroplating bath can include about 140 g/L of sulfuric acid and about 40 g/L of copper ions. These example electrolyte formulations are exemplary in nature and are not intended to be limiting in any way. Where materials other than copper are deposited, the electrolyte will contain the appropriate materials for such deposition, as understood by those of ordinary skill in the art.

Step 115 of FIGS. 1A-1B may involve a series of electrofilling processes. For example, in the embodiment of FIG. 1B, three layers of material are deposited. Copper layer 158 is deposited directly on the seed layer 154. Next, an intermediate layer of nickel 160 is optionally plated on top of the copper layer. This intermediate nickel layer 160 may serve as a diffusion barrier layer. The copper layer 158 and nickel layer 160 together form the deposited structure described herein. The third layer deposited during step 115 in the embodiment of FIG. 1B is a tin-silver solder layer 162. In certain cases, the solder material is not electroplated during this step, but is instead introduced at a later step in the process, as will be described in more detail below.

Another example series of electrofilling processes that may be involved in step 115 is described in U.S. Pat. No. 6,793,796, filed Feb. 28, 2001, the entirety of which is hereby incorporated by reference. The description recites at least four phases of the electrofilling process and discloses controlled current density methods for each phase for optimal filling of relatively small recessed features.

The process 100 continues at step 120 where the photoresist 156 is removed from the substrate. The photoresist 156 may be stripped or otherwise removed from the substrate using the techniques described below (though of course other techniques are possible). Once the photoresist 156 is removed, portions of the seed layer 154 and any barrier layer 152 may be exposed. In the embodiment shown in FIG. 1B, the copper layer 158 is electrodeposited directly on top of the copper seed layer 154. Therefore, for the purpose of clarity, the seed layer 154 and the electrodeposited copper layer 158 are collectively shown as copper layer 158 from this point on.

The process 100 continues at step 125, where the seed 154 and any barrier layers 152 are removed. In some embodiments, for example, the seed 154 and/or the barrier layers 152 that were previously protected by photoresist 156 may be removed by chemical etching.

In certain embodiments, instead of electrodepositing solder material in step 115, solder may be provided at this point in the process. Using this method (not shown in FIGS. 1A-1B), a solder structure contacts a pad of the deposited structure. In some embodiments, the solder structure is a solder structure (e.g., a solder ball) that is mechanically dropped or otherwise placed to contact the pad of the deposited structure. In other embodiments, the solder structure is formed by electrolytically plating solder material onto the pad of the deposited structure.

Solder structures are used to electrically connect IC packaging structures to the interconnects of ICs. For example, pads on a copper containing structure are designated areas upon which soldering, wire bonding, flip chip mounting, or other similar connection can occur. In some embodiments, a solder structure can be affixed on top of the pad, which can be flat or elevated.

The solder structure may include an elemental metal or metal alloy solder material that may be joined with another material to form a seal. In some embodiments, the solder structure may include tin or tin alloy solders. For example, the solder structure may include tin, tin-silver, tin-silver-copper, tin-copper, or tin-lead. While tin-lead may provide good quality "bumps" for packaging and are relatively easy to plate, lead may be less desirable than silver because of its toxicity.

In certain embodiments, the solder structure may be a solder ball with a diameter between about 100 μm and about 500 μm. In other embodiments, the solder structure may be a solder layer plated electrolytically in defined portions of the substrate, as described above in relation to step 115. In certain cases, the solder layer may be between about 10-50 μm thick.

Plating of the solder structure can be accomplished using any suitable electroplating technique known in the art. Plating of solder material, such as binary tin-silver or ternary tin-silver-copper, can be accomplished using an electroplating bath solution containing ions of two different metals as described in U.S. patent application Ser. No. 13/305,384, filed Nov. 28, 2011, the entirety of which is herein incorporated by reference.

The process 100 continues at step 130, where liquid flux 152 is dispensed onto the wafer. A spin coater may be used to accomplish this fluid delivery in certain embodiments. The flux may be used to prevent oxidation of the underlying materials and allow solder to flow easily on the work piece rather than forming beads as may otherwise occur. It is desirable to prevent oxidation of the underlying material because solder materials may attach very well to certain materials and poorly to oxidized forms of those materials. An example is tin-silver solder in the context of copper and copper oxide. The tin-silver solder attaches very well to copper, but poorly to copper oxide. Because copper oxides readily form at the temperatures used for soldering, the flux is used, in part, to provide a strongly reducing environment (at the elevated temperatures used for soldering) to prevent such oxidation of the surface. In this way, the solder is able to maintain good adhesion to the underlying copper material.

The process 100 continues at step 135, where the solder structure 162 is reflowed to allow formation of a solder joint with the deposited structure. In other words, the solder structure is carefully melted or reflowed to facilitate creation of an electrically conductive interface attached to the pad of the deposited structure.

Figure 3:
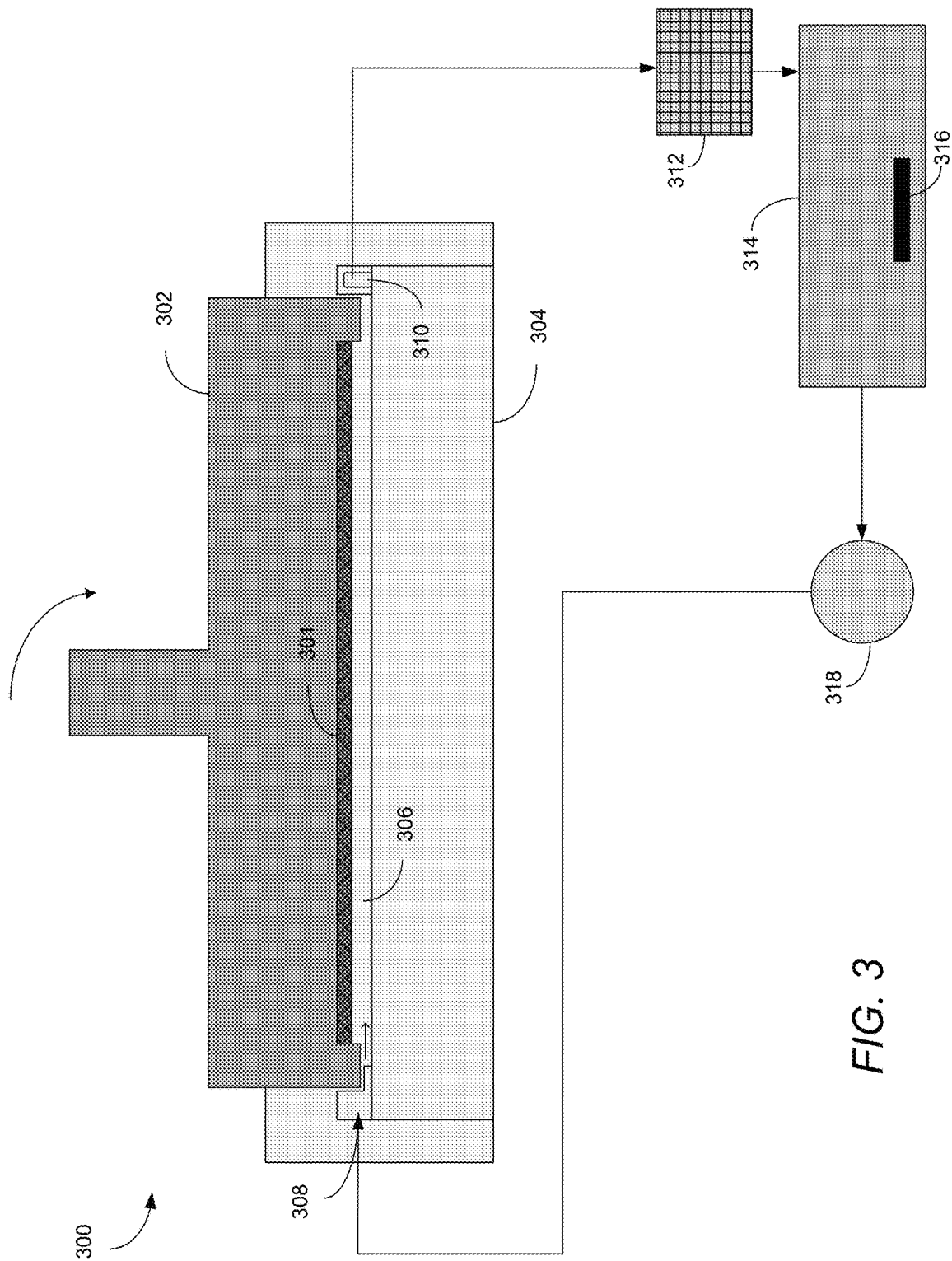
FIG. 3 illustrates a simplified cross-sectional view of a removal cell and its associated fluid loop.

FIG. 2 shows a process flowchart for one approach to carrying out the photoresist strip step 120 of FIG. 1, and will be described with reference to the apparatus shown in FIGS. 3-4. Photoresist stripping process 200 begins at step 205 where a photoresist-coated substrate 301 is received and sealed in, for example, a substrate holder 302 in a removal cell 300. The substrate holder 302, sometimes also referred to as a wafer holder, supports the periphery of the substrate in a roughly ring-shaped cup in order to hold the substrate in place. A cone may press down on the back side of the substrate to help secure it in the cup The substrate 301 is oriented such that the photoresist-coated surface faces away from the substrate holder 302. In the embodiment of FIG. 3, the photoresist-coated surface of the substrate 301 faces downwards.

While some aspects described herein may be employed in various types of apparatus, for simplicity and clarity, most of the discussion concerns wafer-face-down, "fountain" stripping apparatus. In such apparatus, the work piece to stripped (typically a semiconductor wafer in the examples presented herein) generally has a substantially horizontal orientation (which may in some cases vary by a few degrees from true horizontal for some part of, or during the entire stripping process) and is powered to rotate during stripping. The fountain stripping apparatus has many design features in common with analogous "fountain" plating apparatus. One example of a member of the fountain plating class of cells/apparatus is the Sabre® Electroplating System produced by and available from Lam Research Corporation of Fremont, Calif. Additionally, fountain electroplating systems are described in, e.g., U.S. Pat. No. 6,800,187, filed Aug. 10, 2001 and U.S. Pat. No. 8,308,931, filed Nov. 7, 2008, which are incorporated herein by reference in their entireties. Though the discussion herein focuses on this type of horizontal substrate orientation, other orientations are possible. In one example, the wafer may be oriented in a substantially vertical manner.

The photoresist material is typically deposited some distance away from the edge of the substrate, e.g., about 1 mm, leaving a strip of metal substrate exposed around the periphery of the wafer. The substrate holder 302 seals onto the substrate 301 at this exposed metal region, rather than on the photoresist itself. This arrangement forms a reliable seal and prevents photoresist from being trapped by the substrate holder, which could cause that trapped material to undesirably remain on the substrate. It is beneficial to seal the substrate in the substrate holder because it helps prevent fluid leakage that may require excessive quantities of stripping chemicals and otherwise cause poor fluid dynamics (e.g., flow that is discontinuous near the edge of the wafer) within the removal cell.

The process 200 continues at step 210, where the substrate 301 is rotated and immersed in heated stripping solution. The rotation may begin before, during or after immersion. In some embodiments, the rotation occurs at a rate between about 1-20 RPM, e.g., between about 5-15 RPM. In the embodiment of FIG. 3, the stripping solution fills cavity 306 between the plating face of substrate 301 and a bottom plate 304, which are substantially parallel to one another (e.g., within about 20°). In some cases, the substrate holder may be positioned in the removal position (i.e., immersed position) before any fluid enters the cavity 306. In other cases, fluid is provided on the baseplate before the substrate holder moves into the removal position. The stripping solution enters cavity 306 through a flow distributor 308, which will be described in more detail below, and exits cavity 306 through outlet 310. The fluid may flow at a rate between about 20-50 LPM in various cases. The flow distributor 308 includes a C-shaped internal manifold spanning a section of the peripherally located flow distributor. In one example, the internal manifold spans about 120° of the periphery of the substrate. This arrangement allows stripping solution to enter cavity 306 at one side of the cell, travel across the cavity in a substantially linear cross flow pattern, and then exit the cell at outlet 310. This produces a shearing action on the face of the substrate. Because the substrate 301 is rotating when it is immersed in stripping solution, the linear flow patterns are averaged out over the face of the wafer, providing superior material removal results. In other words, by creating a spatially uniform convective flow field under the wafer and rotating the wafer, each feature, and each die exhibits a nearly identical flow pattern over the course of the rotation and the plating process.

At step 215, the substrate is maintained immersed in the stripping solution for a duration of time. The duration of solution exposure will depend on various factors including the chemistry involved, the temperature of the solution, the flow rate of the solution, the thickness and other geometrical characteristics of the photoresist to be stripped, the exact geometry of the removal cell, etc. In a typical embodiment, the substrate may stay immersed until the photoresist is completely or substantially completely removed. In some embodiments, complete removal is achieved in less than about 5 minutes, e.g., less than about 4 minutes, less than about 3 minutes, or less than about 2 minutes. In some implementations, the material to be removed is completely removed. In other implementations, the material is substantially completely removed (i.e., at least 99% of the material is removed). In yet other implementations, less of the material may be removed (e.g., at least 25% of the material, at least 50% of the material, at least 75% of the material, or at least 90% of the material).

Figure 4:
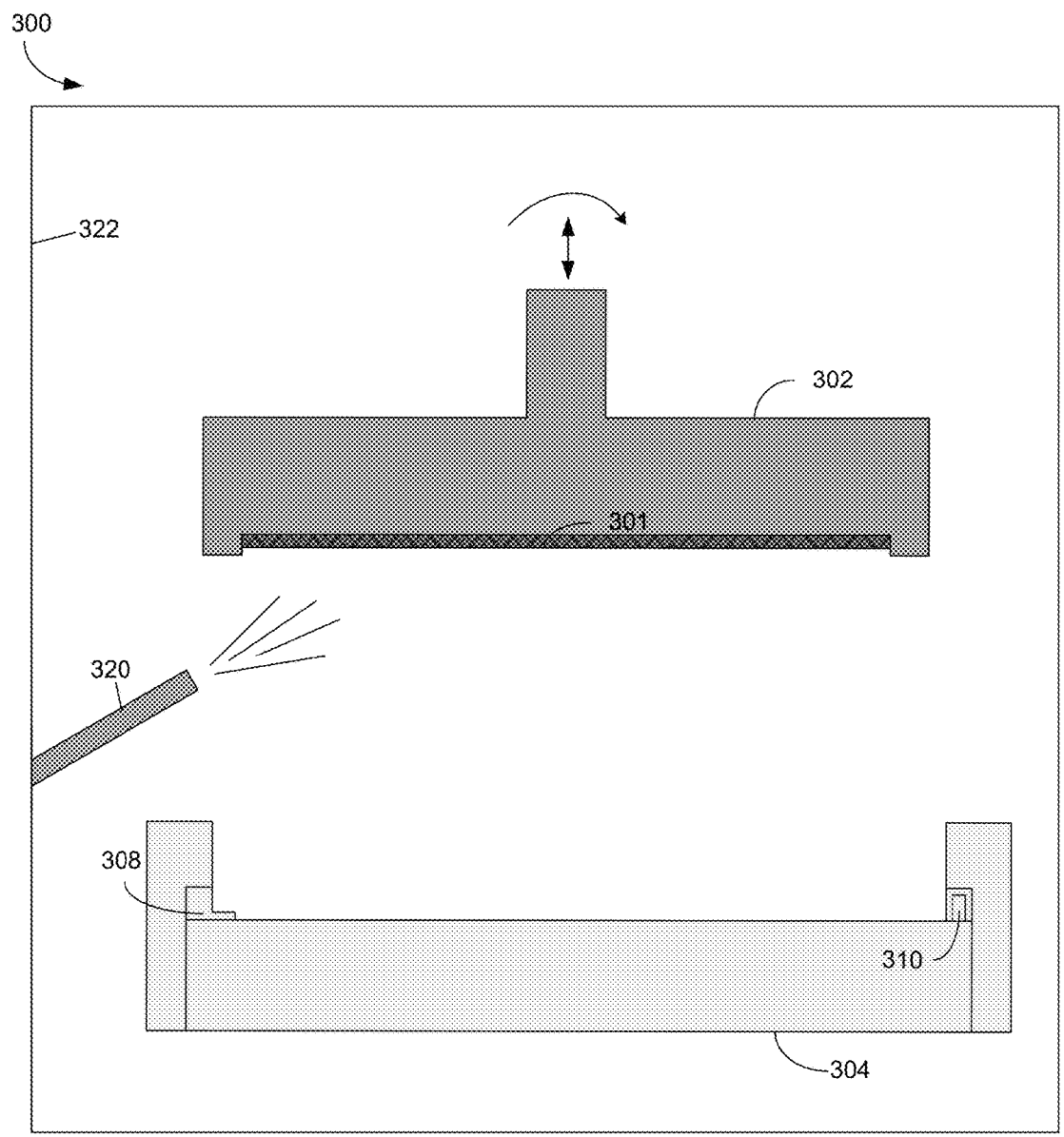
FIG. 4 shows a simplified cross-sectional view of a removal cell with a substrate holder in a rinsing position.

The process 200 then continues at step 220, where the substrate is moved to a rinse position and rinsed, as illustrated in FIG. 4. The rinsing solution may be provided through a rinsing nozzle 320, which may be mounted to the removal chamber walls 322, or to any other piece of the apparatus, as appropriate. In certain implementations, the nozzle may be stationary, while in other implementations, the nozzle may swing or otherwise move into place as needed. In some embodiments, a plurality of rinse nozzles may be used. The rinsing solution may be any appropriate solution, and in certain embodiments is deionized water. The rinsing operation helps remove stripping solution from the surface of the substrate, and also helps remove residual photoresist particles that may be present. The substrate may then be dried at step 225. In some cases, drying may occur through rotation of the substrate at an elevated rotation rate (e.g., between about 1000-2000 RPM).

While the rinsing and drying steps 220 and 225 may occur in the removal cell 300, these steps may alternatively occur in separate rinsing and/or drying modules. These modules may be implemented as part of a multi-tool apparatus.

As shown in FIG. 3, the stripping solution may be provided in a recirculating solution loop. A holding tank 314 may be used to hold a reservoir of stripping solution. The holding tank should be sufficiently large to hold the necessary amount of solution. The amount of solution that is needed will depend on the scale of the substrate/removal chamber/associated plumbing. In a particular embodiment, the holding tank holds about 50 L of solution.

The holding tank 314 may have a heating element 316, as well as temperature control sensors and feedback loops (not shown), which operate to maintain the stripping solution at a desired temperature. The solution exits the holding tank 314 and is delivered to pump 318, which delivers the fluid to the cross flow inlet 308. When a substrate 301 is present and the substrate holder 302 is in the stripping position, narrow cavity 306 forms between the substrate 301 and the bottom plate 304. Solution exits the cross flow inlet 308, travels through cavity 306, and exits at outlet 310. The solution then flows (in some cases over a weir wall, and in other cases through dedicated plumbing), and passes through screen 312. In some implementations, the screen 312 is fairly coarse, having openings on the order of about 1 mm, and operates to remove pieces of photoresist that have fallen off of the substrate surface. The photoresist pieces are typically on the order of a centimeter or a few centimeters. The screen 312 may be located at various positions in the flow loop. In some cases the screen 312 may be a separate element through which the fluid passes before reaching the holding tank 314. This embodiment is shown in FIG. 3. In other cases, the screen 312 may be incorporated into the holding tank 314. In some cases, a filter is used instead of a screen.

The screen 312 should be periodically cleaned to remove the unwanted photoresist or other material. The screen itself generally provides sufficient cleaning of the stripping solution. However, the solution should be periodically changed, or operated under a bleed-and-feed cycle, in order to provide fresh stripping solution as needed.

Apparatus

The methods described herein may be performed by any suitable apparatus having a material removal module as described herein. A suitable apparatus typically includes a system controller having instructions for controlling process operations associated with photoresist stripping or other removal operation and optionally other operations. In some embodiments, the hardware may include one or more process stations included in a process tool or platform.

Some of the embodiments herein relate to removal cells. Certain aspects of these removal cells have been described or mentioned above, and will be more fully described in this section.

A typical removal cell in accordance with the embodiments herein will include a removal chamber having a wafer holder and a flow distributor. The flow distributor may include, among other elements, a base plate (sometimes referred to as a bottom plate), a fluid inlet and a fluid outlet. The fluid inlet may include an internal manifold and a showerhead. The removal cell is also typically associated with a solution holding tank, a screen or other filter, a heater, and a pump in fluidic communication with the removal cell. The overall arrangement of these elements is shown in FIG. 3.

Figure 5:
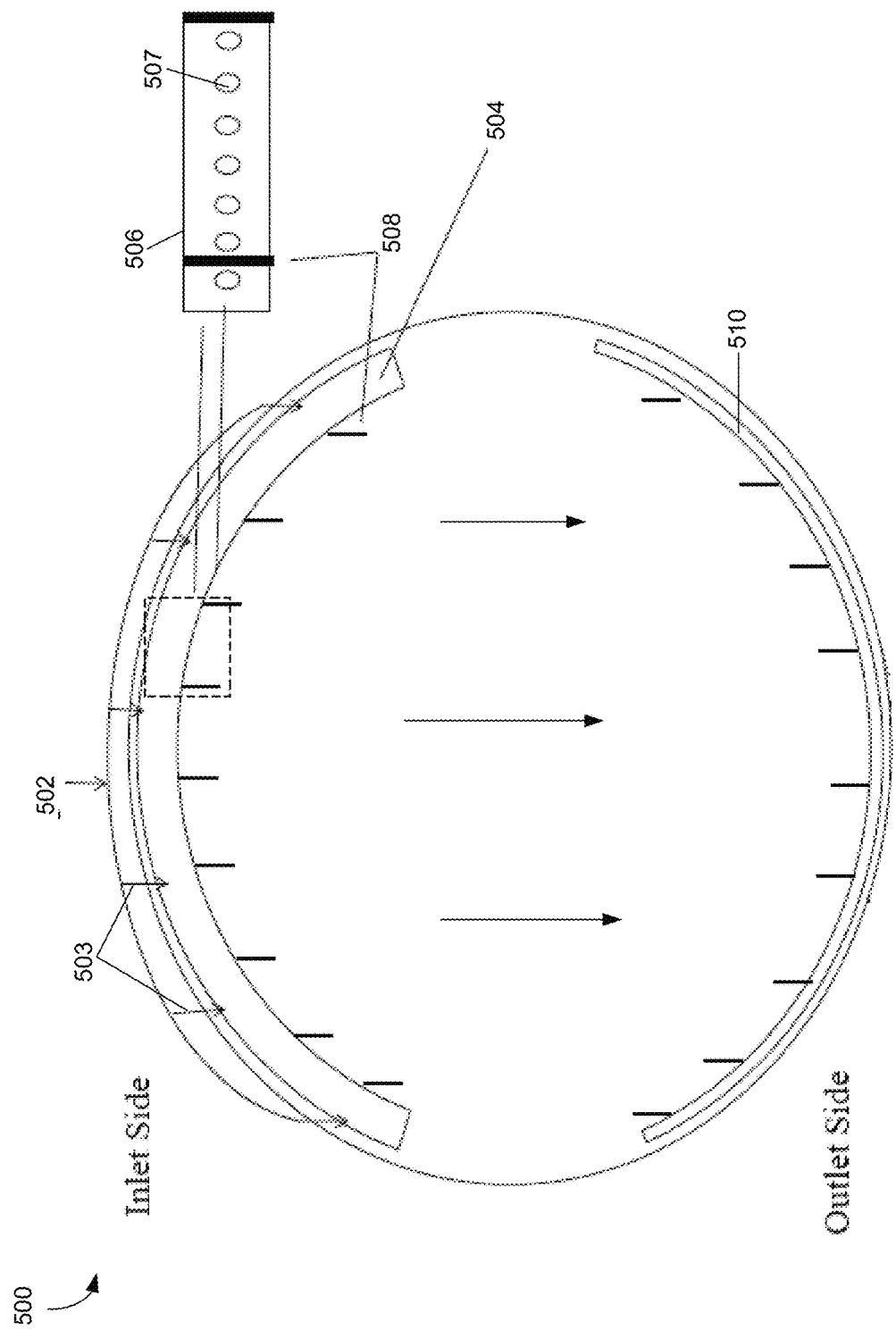
FIG. 5 shows a top-down view of a flow distributor according to an embodiment herein.

FIG. 5 shows a top down view of a flow distributor 500. The flow distributor 500 is typically located at least partially peripherally outside the substrate, and at least partially below the plane of the substrate. As noted above, the flow distributor 500 may include multiple elements including an inlet 504, flow directional fins 508, and outlet 510. In certain embodiments, the base plate may be implemented as part of the flow distributor, though in other cases the base plate may be a separate element. The inlet 504, may include multiple elements including an internal manifold (sometimes referred to as an inlet manifold or cross flow injection manifold) (not visible in FIG. 5) and a manifold showerhead 506 having a plurality of showerhead holes 507. The showerhead holes 507 are sometimes oriented such that the fluid exiting the holes is traveling in a direction parallel to the face of the substrate. In other cases, the showerhead holes 507 are oriented such that the fluid exiting the holes initially travels upward toward the plating face of the substrate. Typically, when the showerhead holes 507 are oriented in the latter fashion, the flow direction is changed from (a) towards the substrate to (b) parallel to the substrate, often through interaction with an element of the flow distributor (e.g., the flow may change direction after encountering a surface of the flow distributor).

Figure 6:
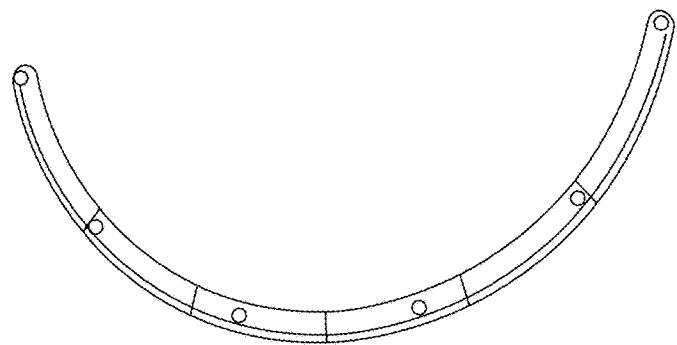
FIG. 6 illustrates an inlet manifold having six separate sub-regions.

In some embodiments, the internal manifold forms a continuous fluidically coupled cavity within the flow distributor 500. In this case the cross flow feed channel(s) exit into one continuous and connected internal manifold chamber. In other embodiments, the internal manifold is divided into angularly distinct and completely or partially separated segments. The flow to each segment may be independently controlled in some cases. In a specific embodiment, each of these angularly distinct segments is fluidly coupled to a separate feed channel 503 disposed in the flow distributor 500. In some cases, flow constricting rods may be placed in the fluid inlet paths to help control the flow of fluid delivered to each segment of the inlet. The internal manifold/inlet/showerhead sub-regions are illustrated in FIG. 6. In certain embodiments, each of these distinct sub-regions of the internal manifold has the same volume and/or the same angular extent. Similarly, the outlet may be divided into angularly distinct sub-regions in the same manner as the inlet. As such, the teachings herein regarding multi-section inlets also apply to multi-section outlets.

The number of individual inlet channels and sub-regions may be between about 1-12, for example between about 4-6. In one embodiment, there are 6 inlet channels, as shown in FIG. 5. The solution inlet may be divided into a plurality of inlets in order to provide uniform linear flow over the face of the wafer. If the inlet were not divided, there would be a pressure differential between angularly distinct fluid entry points, causing the fluid to flow across the face of the substrate at different velocities, thereby forming a less uniform flow pattern. The inlet channels 503 feed the internal manifold, which then feeds showerhead 506 of inlet 504.

The internal manifold is an azimuthal cavity which may be a dug out channel within the flow distributor 500 that can distribute the fluid from the various individual feed channels 503 to the various multiple flow distribution holes 507 of the cross flow showerhead plate 506. This internal manifold (and the associated inlet 504) is located along an angular section of the peripheral or edge region of the flow distributor 500, which is positioned around and slightly outside the periphery of the substrate when engaged. In some cases, the internal manifold and inlet 504 span a section that is between about 90-180° (e.g., between about 120-170°, or between about 140-150°) around the periphery of the substrate. In a particular case, the internal manifold and inlet span about 120° around the periphery of the substrate. The showerhead 506 may span these same angular extents.

Figure 7:
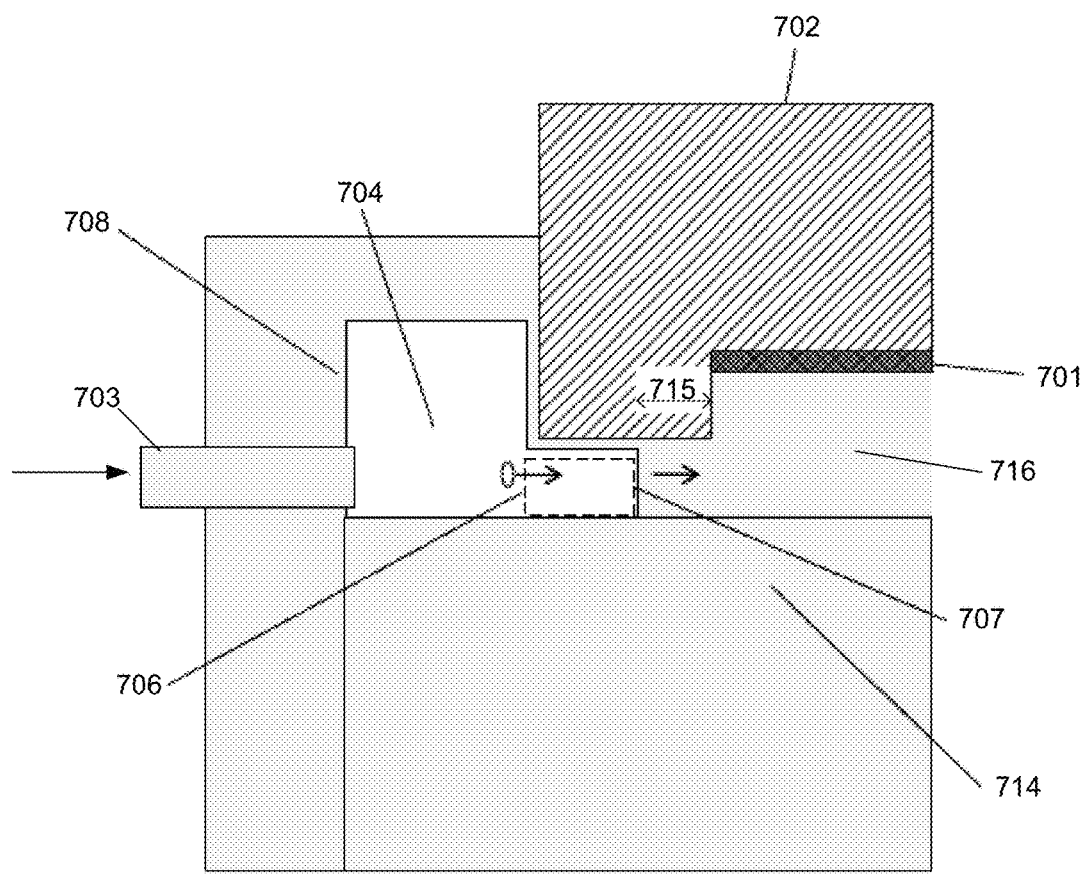
FIG. 7 shows a close-up cross-sectional view of the inlet side of the flow distributor engaged with other components of the apparatus, according to an embodiment herein.

As shown in more detail in FIG. 7, the internal manifold 704 may have an "L-shaped" cross section, where the manifold extends both (a) up the peripheral outside vertical surface of substrate holder 702, as well as (b) under the horizontal bottom surface of the substrate holder 702. The taller outer part of the manifold may be between about 5-20 mm tall, for example between about 10-15 mm tall, and in one embodiment is about 8.5 mm tall. The length of the taller section of the internal manifold (as measured in a horizontal radial direction in the embodiment of FIG. 7) may be between about 5-20 mm in a number of cases, and in one embodiment is about 15 mm long. In some embodiments, the shorter inner part of the internal manifold may be between about 2-10 mm tall, for example between about 4-6 mm tall, and in one embodiment is about 2.5 mm tall. The shorter inner part of the manifold may have a length that is between about 2-10 mm long, for example between about 4-6 mm long, and in one embodiment is about 6 mm long.

The internal manifold 704 and associated showerhead 706 extend horizontally partially under the substrate holder 702. While it is feasible for the showerhead 706 to extend all the way to the inner bottom corner of the substrate holder 702, it may be desirable to terminate the showerhead 706 under the substrate holder 702 such that there is some distance 715 between the showerhead holes 707 and this corner of the substrate holder 702. This separation distance 715 may be beneficial because it helps ensure that the flow is more established and uniform when it flows over the face of the substrate 701. In some embodiments, the distance 715 may be between about 2-30 mm, for example between about 10-15 mm. Without such distance 715, the edge of the wafer could experience certain non-uniformities due to the initial flow conditions out of showerhead holes 707.

In the depicted embodiment, there is a small gap (e.g., between about 0.25-2.5 mm across) between the internal manifold 704 and the wafer holder 702. The horizontally oriented gap may have the same or different gap distance than the vertically oriented gap. In certain implementations, the vertically oriented gap has a width between about 0.5-8 mm. In these or other implementations, the horizontally oriented gap has a height between about 0.25-8 mm. In one embodiment, the horizontally oriented gap under the substrate holder 702 is about 0.5 mm tall, and the vertically oriented gap outside the substrate holder 702 is about 2 mm wide. These narrow gaps prevent fluid leakage, thereby promoting desirable hydrodynamic conditions over the face of the wafer 701. Further, the outer/tall portion of the internal manifold 704 may help to establish uniform flow patterns over the face of the wafer by creating a larger reservoir from which fluid is delivered to the manifold showerhead 706.

In certain other embodiments (not shown), the internal manifold may be flat instead of L-shaped. In these embodiments, there may be another resistance-inducing element near the bottom of the substrate holder. The resistance inducing element may be anything which restricts the flow of fluid in areas outside of the cavity between the substrate 701 and base plate 714. In one example, the additional resistance inducing element is a block of material that partially extends up the outer wall of the substrate holder 702, analogous to the tall part of the internal manifold 704 shown in FIG. 7. In another example, a seal (e.g., a flexible seal) is positioned between the substrate holder 702 and some part of the flow distributor 708 (e.g., the internal manifold 704, showerhead 706, etc.). The use of a seal may be less desirable in terms of apparatus degradation and replacement costs than the other embodiments disclosed herein. Regardless of the geometry of the internal manifold 704, fluid is provided to the manifold 704 through inlet(s) 703.

Returning to FIG. 5, the outlet of the internal manifold 504 is referred to as a manifold showerhead 506. Stripping solution is fed into the showerhead 506 and exits through a plurality of small holes 507 that are directed parallel to the wafer plane and base plate. The use of a large number of holes is advantageous in producing a uniform flow over the surface of the wafer. In some embodiments, the manifold showerhead 506 includes between about 100-200 individual holes 507. In the embodiment of FIG. 5, the showerhead holes 507 may not be drawn to scale. There will typically be more than 6 holes 507 between each pair of directional fins 508, though this is not necessarily always the case.

After the solution exits the showerhead holes 507, the flow is directed by a plurality of flow directional fins 508, which may be implemented as part of the flow distributor 500 or as separate elements. The number of fins 508 near each of the inlet and outlet sides of the flow distributor 500 may range from about 2-30. In some cases, more than 30 fins are used. The directional fins 508 define largely segregated fluid passages under a surface of the substrate holder and between adjacent directional fins 508. In some cases, the purpose of the fins is to redirect and confine flow exiting from the manifold showerhead holes 507 from an otherwise radially inward direction to a "left to right" flow trajectory (left being the inlet side of the cross flow, right being the outlet side). The solution exiting the holes 507 of the manifold showerhead 506 is directed by the directional fins 508 along a flow streamline caused by the orientation of the directional fins 508. In certain embodiments, all the directional fins 508 of the flow distributor are parallel to one another, as shown in FIG. 5. This helps to establish a uniform cross flow direction within the internal manifold. In various embodiments, the directional fins 508 are disposed both along the inlet and outlet side of the flow distributor 508, as shown in FIG. 5.

Returning to FIG. 7, after solution exits the manifold showerhead 706 through showerhead holes 707, it enters cavity 716 defined on the top by the substrate 701 (note that around the very edge, cavity 716 is defined on the top by the bottom surface of the substrate holder rather than the substrate itself) and on the bottom by base plate 714. This cavity 716 is substrate-shaped (e.g., disc-shaped) and extends under the exposed surface of the substrate. The diameter of the cavity is slightly larger than the diameter of the work piece, and in certain cases these two diameters are practically identical. In various implementations, the height of the cavity 716 is between about 2-15 mm, e.g., 8-10 mm. This height is fairly short to promote shearing of the substrate face by imparting a high cross-flow rate through the cavity 716. This high flow rate through a narrow cavity may promote more turbulent flow near the face of the wafer, which is beneficial in terms of material removal/cleaning results. The flow directional fins shown in FIG. 5 are located in cavity 716.

The embodiment of FIG. 7 shows a step in cavity 716 where it extends around the corner of the substrate holder, though this step is not present in all embodiments. In certain cases, the peripheral bottom surface of wafer holder 702 may be angled such that there is a slope between the showerhead holes 707 and the edge of the substrate 701. Where a step is present, it should be minimal in height (i.e., the step should be very short in the direction perpendicular to the substrate). This short step height helps ensure that the height of cavity 716 remains small, promoting favorable hydrodynamic conditions over the face of the substrate 701. In order to achieve a small step, the substrate holder should have a very thin bottom thickness (e.g., less than about 5 mm, less than about 3 mm, or less than about 1.5 mm).

After the solution passes through cavity 716, it exits through an outlet manifold (not shown) in the flow distributor 708. The outlet manifold may span between a section that is between about 90-180° (e.g., between about 120-170°, or between about 140-150°) around the periphery of the substrate. In a particular case, the outlet manifold spans about 120° around the periphery of the substrate.

Figure 8:
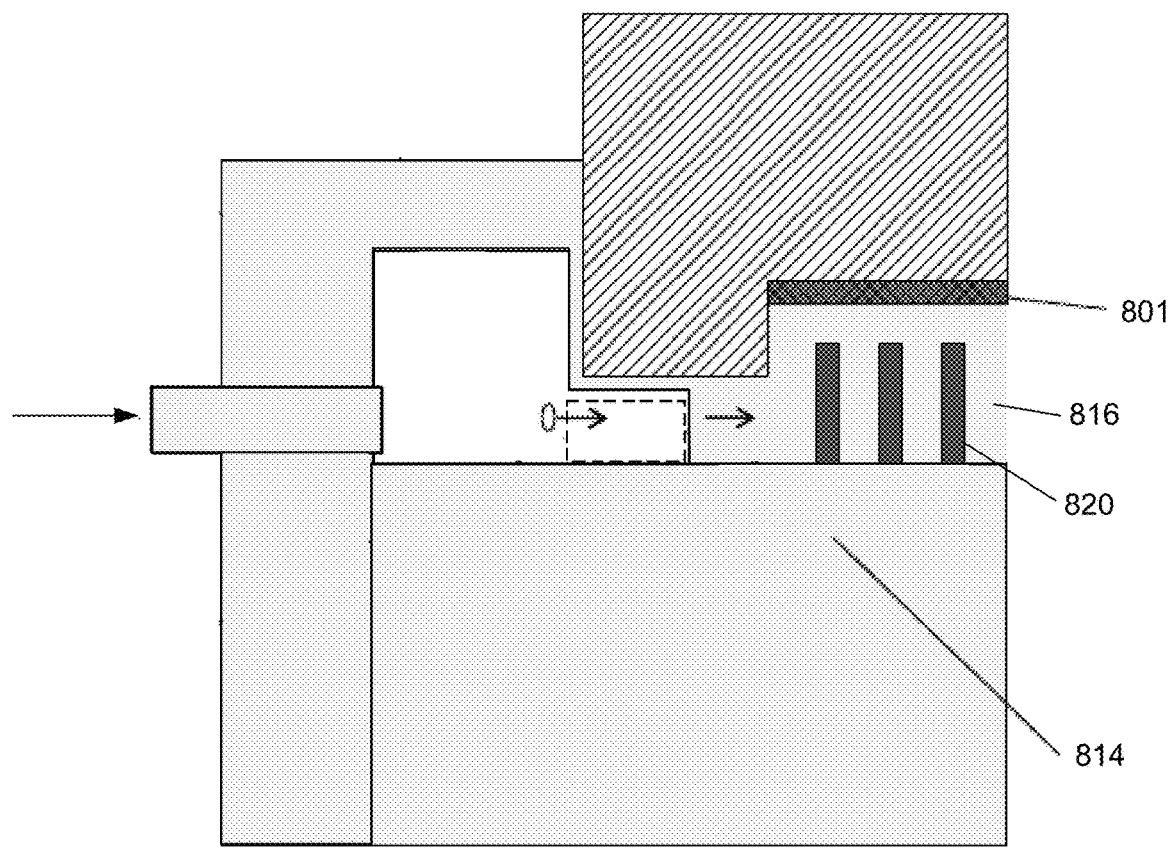
FIG. 8 shows an additional embodiment of the removal apparatus having protuberances extending from the base plate towards the wafer.

FIG. 8 shows an alternative embodiment having a plurality of protuberances 820 located in the cavity 816 between the substrate 801 and the base plate 814 and oriented perpendicular to the cross flow across the substrate 801. The protuberances modify a flow field adjacent to the wafer to increase mass transfer to the wafer and improve the uniformity of the mass transfer over the face of the wafer. This may be accomplished by increasing the local Reynolds number (Re) of the fluid adjacent to the surface of the wafer, and providing a more uniform cross flow over the surface of the wafer.

The protuberances may be provided as relatively long, thin shapes that operate to promote significantly higher flow velocities through cavity 814, thereby achieving improved fluid dynamics for material removal. In other words, the protuberances create localized turbulent zones near and on the surface of the wafer.

Figure 9:
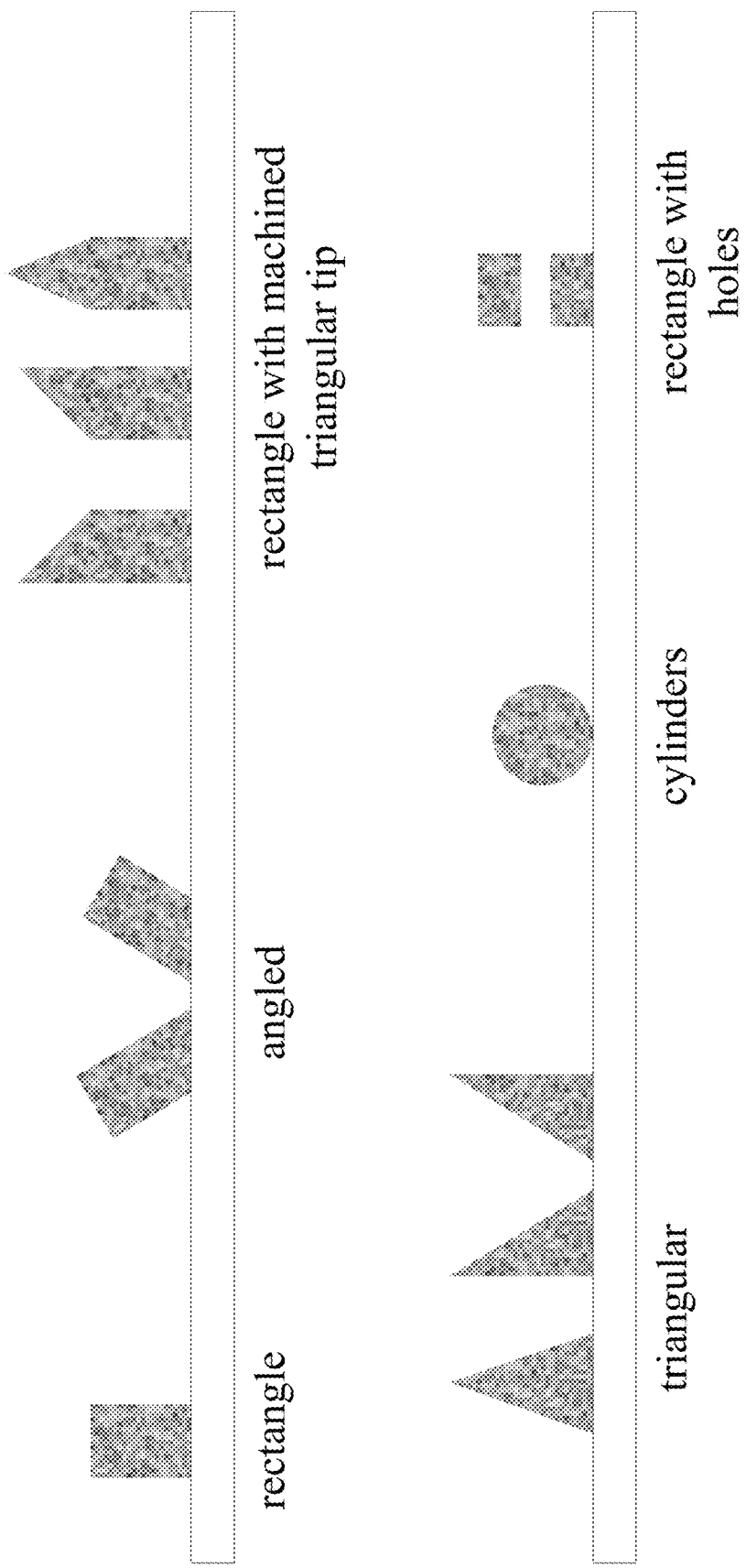
FIG. 9 shows cross-sectional views of various possible protuberance shapes.

FIG. 9 shows various possible embodiments of protuberance shapes. These shapes are intended to be illustrative and not limiting, and one having ordinary skill in the art would recognize that various protuberance shapes, sizes and orientations are contemplated to be within the scope of the invention. The protuberances are typically thin and long, and are oriented perpendicular to the direction of the cross flow. The protuberances may be normal to the base plate surface or may be angled. They may be rectangular, triangular, cylindrical, some combination thereof, or a different shape. In certain implementations the protuberances may have holes to further affect the flow of plating solution. The protuberances may be continuous or discontinuous along their length. In some cases the protuberances may extend across the entire face of the base plate. In other cases the peripheral edge region of the base plate is free of protuberances.

In some embodiments, the protuberances may be of varying shapes and/or sizes (for example, alternating rectangular and triangular protuberances). Certain shapes may have fluidic advantages, for example, a rectangular protuberance with a triangular tip may result in greater shear of the fluid and/or a higher propensity of forming vortices within the stripping solution.

In some embodiments, the protuberance height is between about 30-85% of the distance between the base plate and wafer surface. For example, if the distance between the base plate and wafer is 6 mm, the height of the protuberances should be between about 2-5 mm, for example between about 2-4 mm. Another way to characterize the protuberance height is by specifying the distance between the substrate surface and the top of the protuberance(s). In many implementations, this distance is between about 1 and 4 mm. For example, if the gap between the base plate and wafer surface is 10 mm and the tops of the protuberances are about 1 to 4 millimeters away from the surface of the wafer, this means that the protuberances are about 6 to 9 millimeters tall (10-4 mm=6 mm, to 10-1 mm=9 mm). The maximum height of the protuberance may be limited by certain flow characteristics in the system. The protuberance should be tall enough such that it is able to induce a turbulent flow (e.g., Re>1400) in the base plate to wafer channel. The protuberances allow the stripping solution to penetrate between features more easily due to the increased turbulent flow near the wafer.

The width of the protuberances may be between about 0.5-3 mm (e.g., between about 1-2 mm). The length of the protuberance may be up to the length of the substrate chord on which the protuberance is positioned. In the center of the substrate, the maximum protuberance length is the diameter of the substrate. In areas away from the center of the substrate, this maximum length will be some lesser distance. Shorter protuberances may also be used. The distance between the protuberances may be between about 2-10 millimeters. This distance may be constant or variable between different sets of protuberances.

Figure 10A:
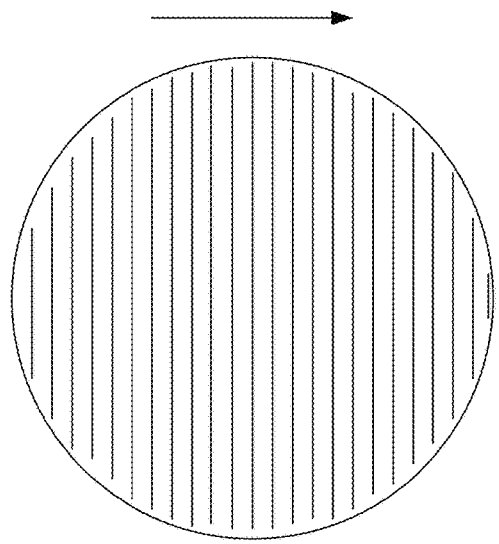
FIGS. 10A-C show top-down views of various possible protuberance layouts on the base plate.
Figure 10B:
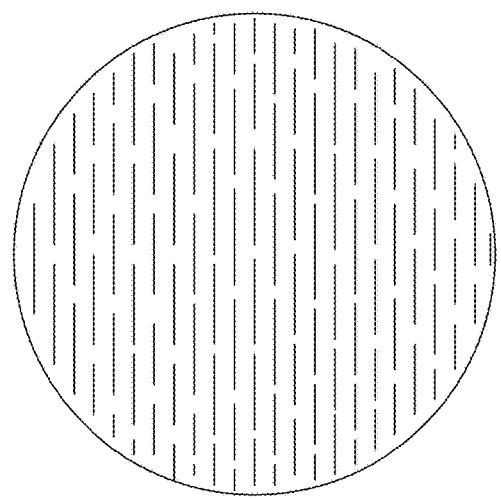
Figure 10C:
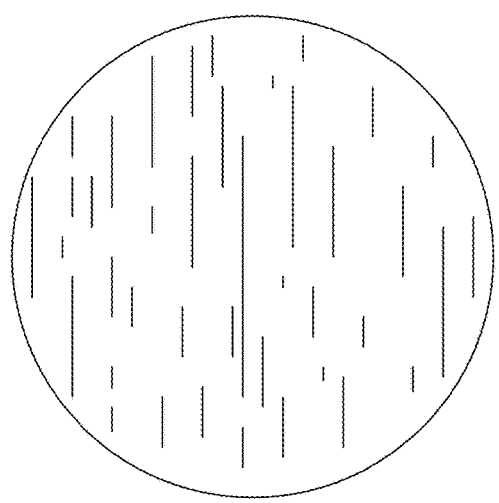

The layout of the protuberances may be systematic or random. Various possible protuberance layouts are presented in FIGS. 10A-C. For each of these figures, the fluid flow is in a left-to-right direction, as indicated by the arrow in the panel of FIG. 10A. In this embodiment, the protuberances extend length-wise over the entire or substantially entire length of the base plate. The protuberances are oriented parallel to one another and perpendicular to the direction of cross flow. In FIG. 10B, the protuberances are arranged in a set-off manner such that channels between the protuberances do not line up with each other in the direction of cross flow. In this embodiment the protuberances may be considered discontinuous in the length-wise direction. In FIG. 10C, the protuberances are arranged more randomly, having substantially varying protuberance lengths, as well as varying distances between adjacent protuberances.

In some embodiments, megasonic or ultrasonic energy is delivered to the substrate surface. In some implementations, a MegPie transducer (not shown) is coupled to the base plate. The MegPie delivers megasonic energy to the base plate, which is transferred to the stripping solution. This megasonic energy helps remove the photoresist or other material from the face of the substrate.

Figure 11:
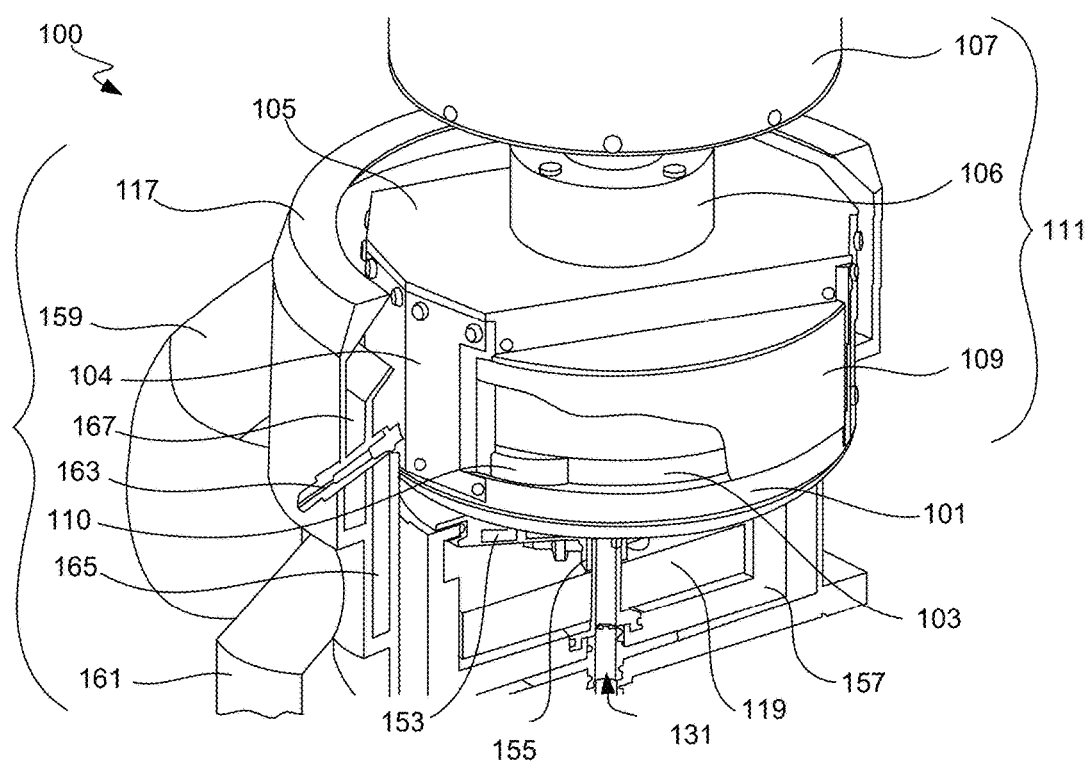
FIG. 11 shows a perspective view of an exemplary substrate holder according to various embodiments herein.

FIG. 11 shows a perspective view of an exemplary substrate holder 100. This substrate holder may be used in connection with various types of semiconductor processing apparatus, including both removal cells and deposition cells. The focus in the following discussion will be on removal cells. The apparatus 100 includes wafer-engaging components, which are sometimes referred to as "clamshell" components, a "clamshell" assembly, or a "clamshell." The clamshell assembly comprises a cup 101 and a cone 103. As will be shown in FIG. 12, the cup 101 holds a wafer, and the cone 103 clamps the wafer securely in the cup. Other cup and cone designs beyond those specifically depicted here can be used. A common feature is a cup that has an interior region in which the wafer resides and a cone that presses the wafer against the cup to hold it in place. The bottom of the cup should have a relatively thin thickness (e.g., less than about 5 mm) in order to maintain a narrow gap between the surface of the wafer and the base plate. The cup may be sized to engage with wafers of various diameters; e.g., wafers of diameter, 200 mm, 300 mm, or 450 mm.

In the depicted embodiment, the clamshell assembly (the cup 101 and the cone 103) is supported by struts 104, which are connected to a top plate 105. This assembly (101, 103, 104, and 105) is driven by a motor 107 via a spindle 106 connected to the top plate 105. The motor 107 is attached to a mounting bracket (not shown). The spindle 106 transmits torque (from the motor 107) to the clamshell assembly causing rotation of a wafer (not shown in this figure) held therein during stripping. An air cylinder (not shown) within the spindle 106 also provides a vertical force for engaging the cup 101 with the cone 103. When the clamshell is disengaged (not shown), a robot with an end effector arm can insert a wafer in between the cup 101 and the cone 103. After a wafer is inserted, the cone 103 is engaged with the cup 101, which immobilizes the wafer within apparatus 100 leaving only the wafer front side (work surface) exposed to solution.

In certain embodiments, the clamshell includes a spray skirt 109 that protects the cone 103 from splashing solution. In the depicted embodiment, the spray skirt 109 includes a vertical circumferential sleeve and a circular cap portion. A spacing member 110 maintains separation between the spray skirt 109 and the cone 103.

For the purposes of this discussion, the assembly including components 101-110 is collectively referred to as a "wafer holder" 111. Note however, that the concept of a "wafer holder" or "substrate holder" extends generally to various combinations and sub-combinations of components that engage a wafer and allow its movement and positioning.

Further, the entire wafer holder 111 is lifted vertically either up or down to immerse the proximal end of wafer holder into a stripping solution (or plating solution) via an actuator (not shown). Thus, a two-component positioning mechanism provides both vertical movement along a trajectory perpendicular to a solution surface and a tilting movement allowing deviation from a horizontal orientation (i.e., parallel to the solution surface) for the wafer (angled-wafer immersion capability).

Figure 12:
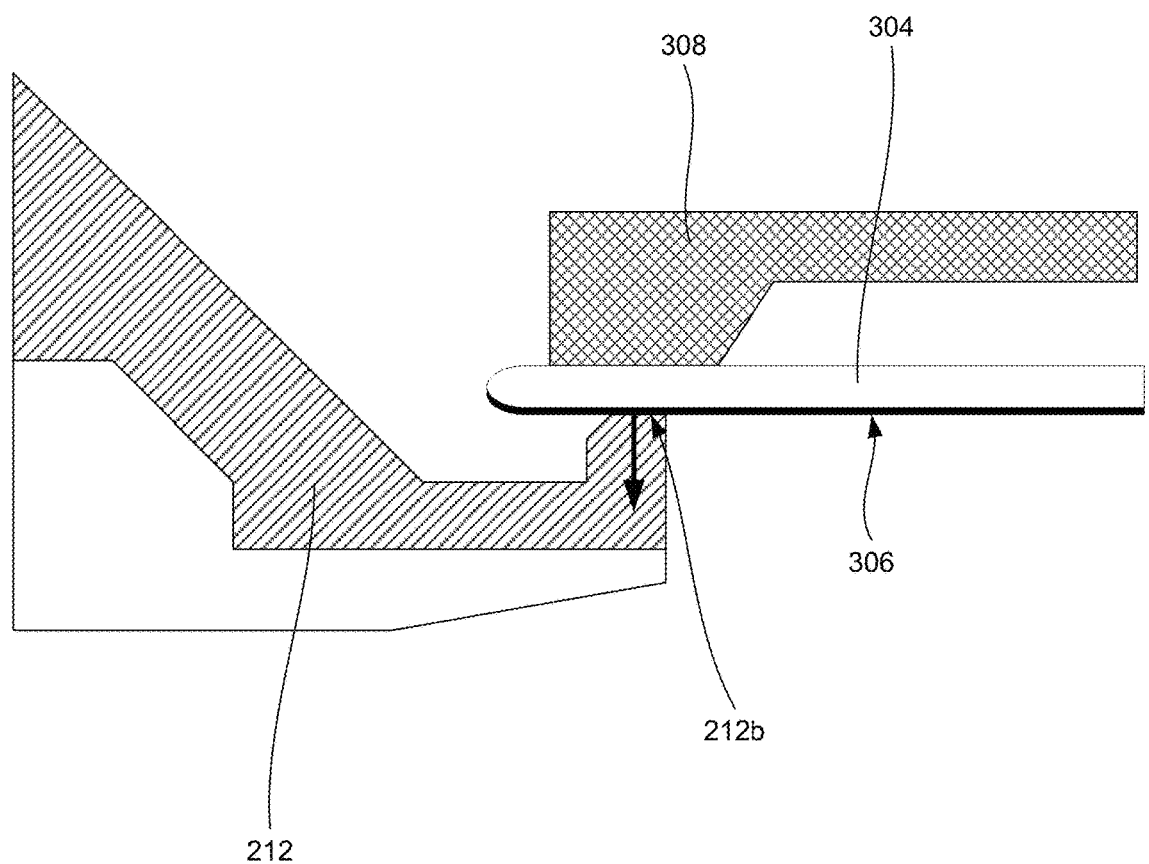
FIG. 12 shows a close up view of an embodiment of a substrate holder engaging a substrate.

FIG. 12 shows a close up view of an embodiment of a substrate holder engaging a substrate 304. The closing operation involves lowering a cup 308 and pressing with the cup 308 onto the back side of the wafer 304. As a result of this pressure, the active surface 306 comes into the contact with the lip 212b of the lipseal 212. The compression also ensures that the entire perimeter of the lip 212b is in the contact with front surface 306, especially if there are some imperfections in surfaces of either one. A lipseal 212 is typically made out of compressible materials.

Figure 13:
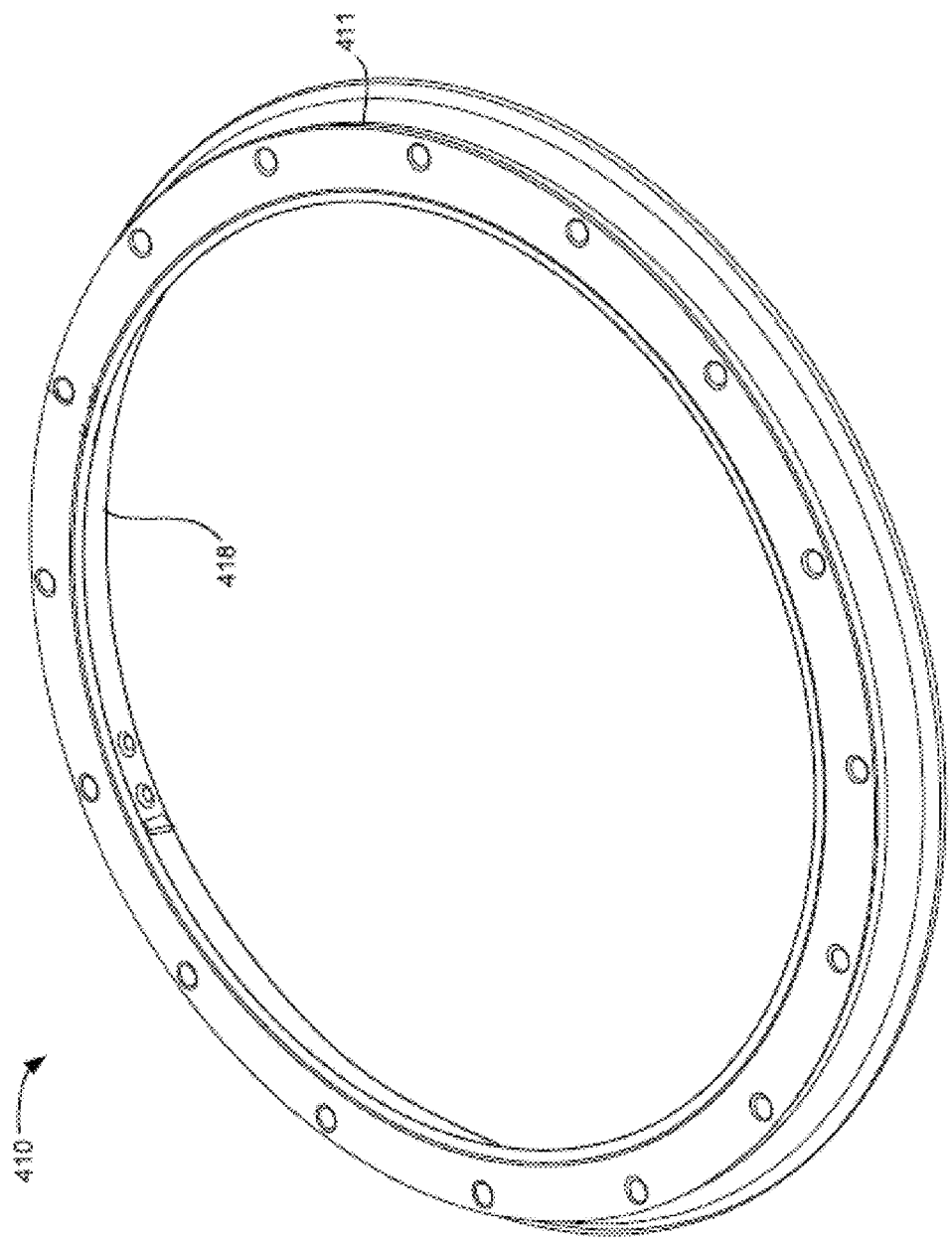
FIG. 13 shows a top down view of a cup that may be used in certain implementations of a substrate holder.

The clamshell assembly shown in FIG. 12 may be used in accordance with the present embodiments (both in removal cells and in plating cells), and in various cases may be implemented on a Sabre® electroplating system supplied by Lam Research Corporation of Fremont, Calif. Implementation of the illustrated clamshell assembly improves sealing and helps protect the substrate and apparatus. It is also permits easy manual cleaning and as well as automatic cleaning, rinsing and cleaning/etching operations (known as cup contact rinse, CCR and automatic contact etch, ACE operations). FIG. 13 shows an embodiment of a clamshell cup 410, which may be implemented as part of the substrate holder. The clamshell 410 includes the elastomeric lipseal 418, which forms a fluid-tight seal around its inner edge.

Figure 14:
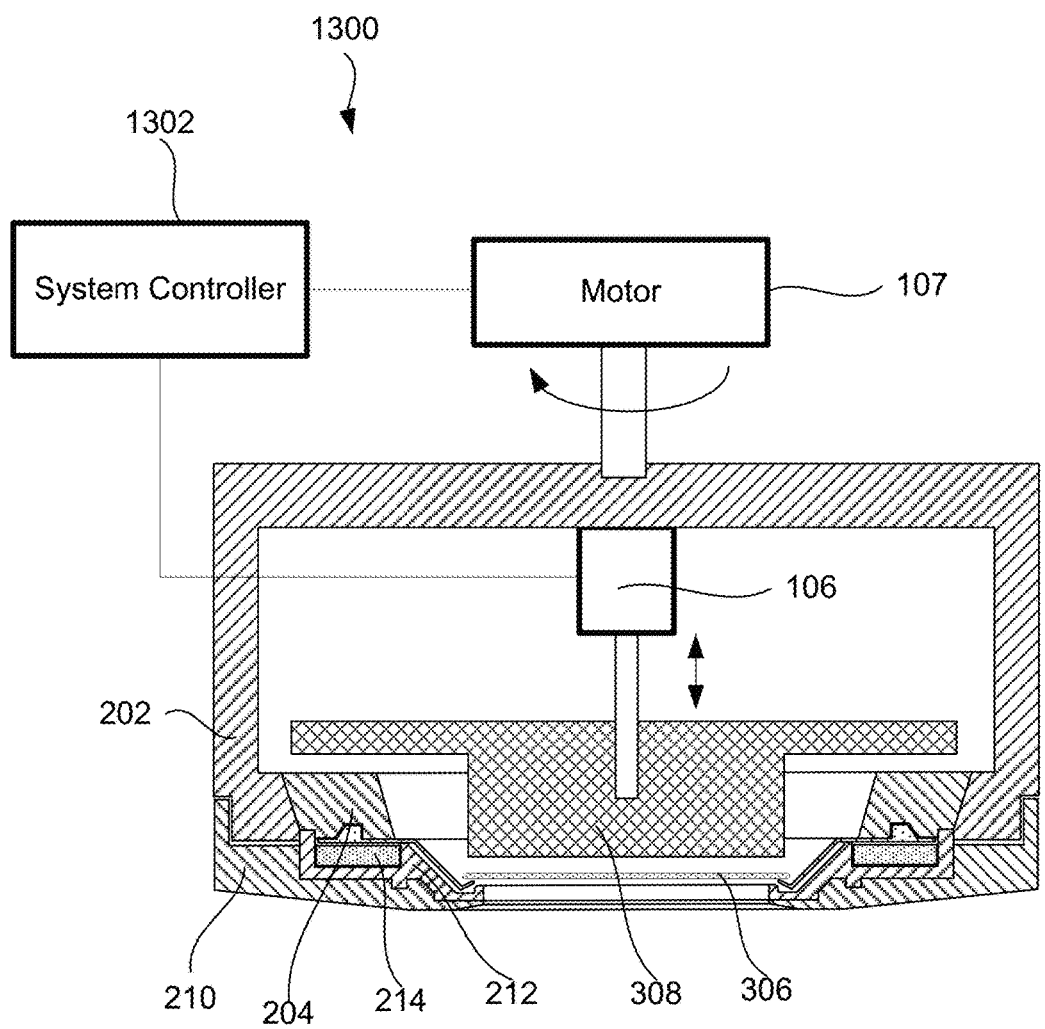
FIG. 14 illustrates a clamshell-type substrate holder engaging a substrate in a processing chamber.

FIG. 14 shows a schematic representation of a typical clamshell assembly that may be used in certain embodiments (e.g., in a removal cell and/or in a plating cell). The apparatus 1300 may have a motor 107 for rotating the clamshell (elements 202, 204, 210, 212, 214, 306, 308 and other) and a shaft 106 with an air cylinder for lifting a cone 308 inside the apparatus. The motor 107 and the shaft 106 are further described in the context of FIG. 11. Operations of the motor 107 and the air cylinder may be controlled by a system controller 1302. In certain embodiments, a system controller 1302 is employed to control process conditions during material stripping (e.g., photoresist stripping, copper or other material deposition, insertion and removal of wafers, etc. The controller 1302 may include one or more memory devices and one or more processors with a CPU or computer, analog and/or digital input/output connections, stepper motor controller boards, etc., and will be described in further detail below.

Figure 15:
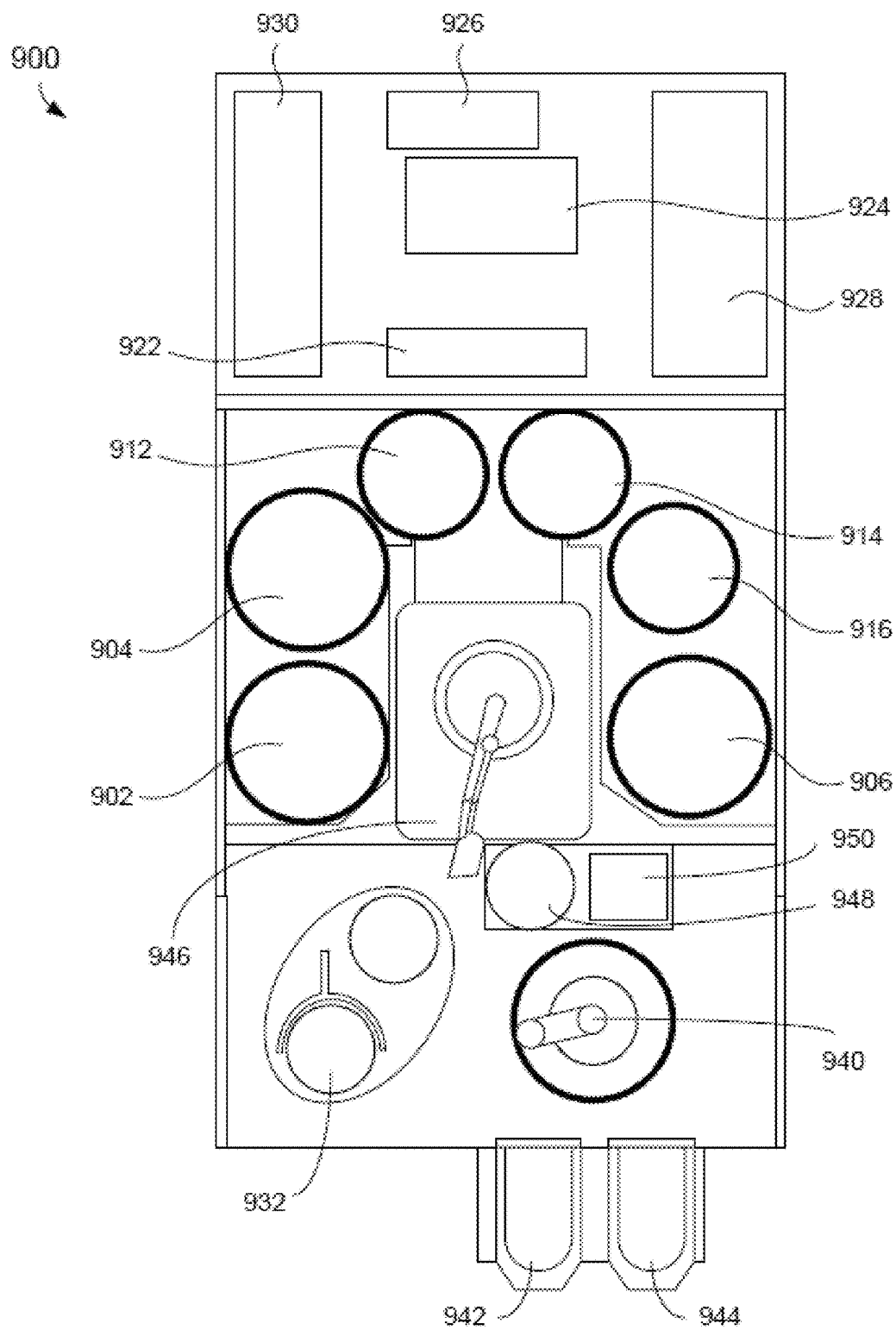
FIG. 15 is a top-down simplified view of a multi-tool semiconductor processing apparatus according to an embodiment disclosed herein.

FIG. 15 shows an exemplary multi-tool apparatus that may be used to implement the embodiments herein. The electrodeposition apparatus 900 can include three separate electroplating modules 902, 904, and 906. The electrodeposition apparatus 900 can also include a stripping module 916. Further, two separate modules 912 and 914 may be configured for various process operations. For example, in some embodiments, one or more of modules 912 and 914 may be a spin rinse drying (SRD) module. In other embodiments, one or more of the modules 912 and 914 may be post-electrofill modules (PEMs), each configured to perform a function, such as edge bevel removal, backside etching, and acid cleaning of substrates after they have been processed by one of the electroplating modules 902, 904, and 906.

The electrodeposition apparatus 900 includes a central electrodeposition chamber 924. The central electrodeposition chamber 924 is a chamber that holds the chemical solution used as the electroplating solution in the electroplating modules 902, 904, and 906. The electrodeposition apparatus 900 also includes a dosing system 926 that may store and deliver additives for the electroplating solution. A chemical dilution module 922 may store and mix chemicals to be used as an etchant. A filtration and pumping unit 928 may filter the electroplating solution for the central electrodeposition chamber 924 and pump it to the electroplating modules.

A system controller 930 provides electronic and interface controls required to operate the electrodeposition apparatus 900. The system controller 930 (which may include one or more physical or logical controllers) controls some or all of the properties of the electroplating apparatus 900. The system controller 930 typically includes one or more memory devices and one or more processors. The processor may include a central processing unit (CPU) or computer, analog and/or digital input/output connections, stepper motor controller boards, and other like components. Instructions for implementing appropriate control operations as described herein may be executed on the processor. These instructions may be stored on the memory devices associated with the system controller 930 or they may be provided over a network. In certain embodiments, the system controller 930 executes system control software.

The system control software in the electrodeposition apparatus 900 may include instructions for controlling the timing, mixture of electrolyte components (including the concentration of one or more electrolyte components), inlet pressure, plating cell pressure, plating cell temperature, mixture of stripping solution components, removal cell temperature, removal cell pressure, substrate temperature, current and potential applied to the substrate and any other electrodes, substrate position, substrate rotation, and other parameters of a particular process performed by the electrodeposition apparatus 900.

System control logic may be configured in any suitable way. For example, various process tool component subroutines or control objects may be written to control operation of the process tool components necessary to carry out various process tool processes. System control software may be coded in any suitable computer readable programming language. The logic may also be implemented as hardware in a programmable logic device (e.g., an FPGA), an ASIC, or other appropriate vehicle.

In some embodiments, system control logic includes input/output control (IOC) sequencing instructions for controlling the various parameters described above. For example, each phase of an electroplating process may include one or more instructions for execution by the system controller 930. The instructions for setting process conditions for an immersion process phase may be included in a corresponding immersion recipe phase. In some embodiments, the electroplating recipe phases may be sequentially arranged, so that all instructions for an electroplating process phase are executed concurrently with that process phase.

The control logic may be divided into various components such as programs or sections of programs in some embodiments. Examples of logic components for this purpose include a substrate positioning component, an electrolyte composition control component, a stripping solution composition control component, a solution flow control component, a pressure control component, a heater control component, and a potential/current power supply control component. The controller may execute the substrate positioning component by, for example, directing the substrate holder to move (rotate, lift, tilt) as desired. The controller may control the composition and flow of various fluids (including but not limited to electrolyte and stripping solution) by directing certain valves to open and close at various times during processing. The controller may execute the pressure control program by directing certain valves, pumps and/or seals to be open/on or closed/off. Similarly, the controller may execute the temperature control program by, for example, directing one or more heating and/or cooling elements to turn on or off. The controller may control the power supply by directing the power supply to provide desired levels of current/potential throughout processing.

In some embodiments, there may be a user interface associated with the system controller 930. The user interface may include a display screen, graphical software displays of the apparatus and/or process conditions, and user input devices such as pointing devices, keyboards, touch screens, microphones, etc.

In some embodiments, parameters adjusted by the system controller 930 may relate to process conditions. Non-limiting examples include solution conditions (temperature, composition, and flow rate), substrate position (rotation rate, linear (vertical) speed, angle from horizontal) at various stages, etc. These parameters may be provided to the user in the form of a recipe, which may be entered utilizing the user interface.

Signals for monitoring the process may be provided by analog and/or digital input connections of the system controller 930 from various process tool sensors. The signals for controlling the process may be output on the analog and digital output connections of the process tool. Non-limiting examples of process tool sensors that may be monitored include mass flow controllers, pressure sensors (such as manometers), thermocouples, optical position sensors, etc. Appropriately programmed feedback and control algorithms may be used with data from these sensors to maintain process conditions.

In one embodiment of a multi-tool apparatus, the instructions can include inserting the substrate in a wafer holder, tilting the substrate, biasing the substrate during immersion, and electrodepositing a copper containing structure on a substrate. The instructions may further include transferring the substrate to a removal cell, immersing the substrate in stripping solution, rotating the substrate, flowing stripping solution from an internal cross flow manifold and across the face of the wafer (including adjusting the flow rate, total or a portion thereof), and removing, rinsing and drying the substrate.

A hand-off tool 940 may select a substrate from a substrate cassette such as the cassette 942 or the cassette 944. The cassettes 942 or 944 may be front opening unified pods (FOUPs). A FOUP is an enclosure designed to hold substrates securely and safely in a controlled environment and to allow the substrates to be removed for processing or measurement by tools equipped with appropriate load ports and robotic handling systems. The hand-off tool 940 may hold the substrate using a vacuum attachment or some other attaching mechanism.

The hand-off tool 940 may interface with a wafer handling station 932, the cassettes 942 or 944, a transfer station 950, or an aligner 948. From the transfer station 950, a hand-off tool 946 may gain access to the substrate. The transfer station 950 may be a slot or a position from and to which hand-off tools 940 and 946 may pass substrates without going through the aligner 948. In some embodiments, however, to ensure that a substrate is properly aligned on the hand-off tool 946 for precision delivery to an electroplating module, the hand-off tool 946 may align the substrate with an aligner 948. The hand-off tool 946 may also deliver a substrate to one of the electroplating modules 902, 904, or 906, or to the removal cell 916, or to one of the separate modules 912 and 914 configured for various process operations.

An apparatus configured to allow efficient cycling of substrates through sequential plating, rinsing, drying, and PEM process operations (such as stripping) may be useful for implementations for use in a manufacturing environment. To accomplish this, the module 912 can be configured as a spin rinse dryer and an edge bevel removal chamber. With such a module 912, the substrate would only need to be transported between the electroplating module 904 and the module 912 for the copper plating and EBR operations. Similarly, where module 916 is a stripping module/removal cell, substrate transfer between stations is relatively efficient and simple.

Figure 16:
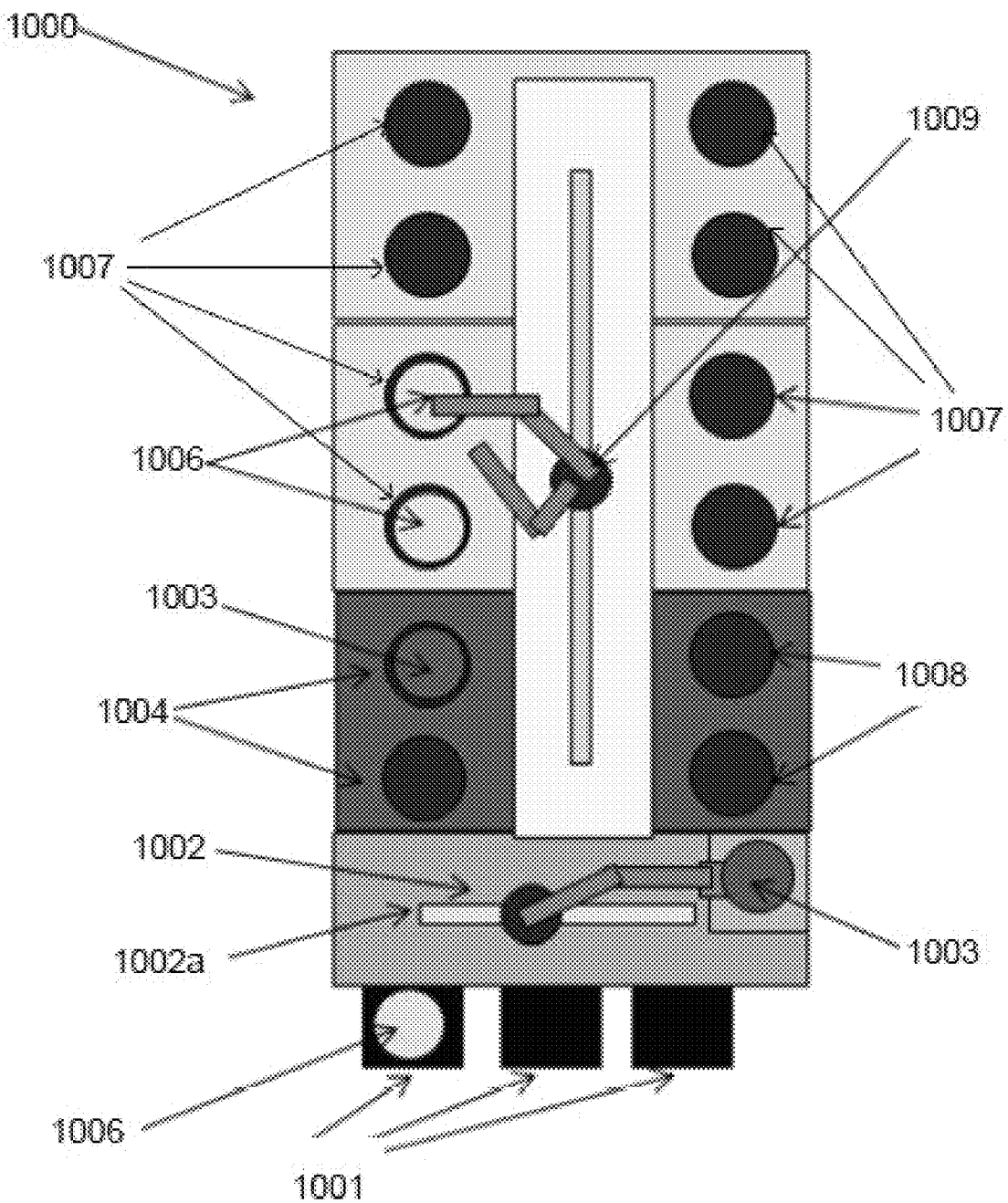
FIG. 16 is a top-down simplified view of an alternative multi-tool semiconductor processing apparatus according to an embodiment disclosed herein.

FIG. 16 shows an additional example of a multi-tool apparatus that may be used in implementing the embodiments herein. In this embodiment, the electrodeposition apparatus 1000 has a set of electroplating cells 1007, each containing an electroplating bath, in a paired or multiple "duet" configuration. In addition to electroplating per se, the electrodeposition apparatus 1000 may perform a variety of other electroplating related processes and sub-steps, such as spin-rinsing, spin-drying, metal and silicon wet etching, electroless deposition, pre-wetting and pre-chemical treating, reducing, annealing, photoresist stripping, and surface pre-activation, for example. The electrodeposition apparatus 1000 is shown schematically looking top down in FIG. 10, and only a single level or "floor" is revealed in the figure, but it is to be readily understood by one having ordinary skill in the art that such an apparatus, e.g. the Lam Research Sabre™ 3D tool, can have two or more levels "stacked" on top of each other, each potentially having identical or different types of processing stations.

Referring once again to FIG. 16, the substrates 1006 that are to be electroplated are generally fed to the electrodeposition apparatus 1000 through a front end loading FOUP 1001 and, in this example, are brought from the FOUP to the main substrate processing area of the electrodeposition apparatus 1000 via a front-end robot 1002 that can retract and move a substrate 1006 driven by a spindle 1003 in multiple dimensions from one station to another of the accessible stations—two front-end accessible stations 1004 and also two front-end accessible stations 1008 are shown in this example. The front-end accessible stations 1004 and 1008 may include, for example, pre-treatment stations, and spin rinse drying (SRD) stations. These stations 1004 and 1008 may also be removal stations as described herein. Lateral movement from side-to-side of the front-end robot 1002 is accomplished utilizing robot track 1002a. Each of the substrates 1006 may be held by a cup/cone assembly (not shown) driven by a spindle 1003 connected to a motor (not shown), and the motor may be attached to a mounting bracket 1009. Also shown in this example are the four "duets" of electroplating cells 1007, for a total of eight electroplating cells 1007. The electroplating cells 1007 may be used for electroplating copper for the copper containing structure and electroplating solder material for the solder structure (among other possible materials). A system controller (not shown) may be coupled to the electrodeposition apparatus 1000 to control some or all of the properties of the electrodeposition apparatus 1000. The system controller may be programmed or otherwise configured to execute instructions according to processes described earlier herein.

The various hardware and method embodiments described above may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility.

Lithographic patterning of a film typically comprises some or all of the following steps, each step enabled with a number of possible tools: (1) application of photoresist on a workpiece, e.g., a substrate having a silicon nitride film formed thereon, using a spin-on or spray-on tool; (2) curing of photoresist using a hot plate or furnace or other suitable curing tool; (3) exposing the photoresist to visible or UV or x-ray light with a tool such as a wafer stepper; (4) developing the resist so as to selectively remove resist and thereby pattern it using a tool such as a wet bench or a spray developer; (5) transferring the resist pattern into an underlying film or workpiece by using a dry or plasma-assisted etching tool; and (6) removing the resist using a tool such as an RF or microwave plasma resist stripper. In some embodiments, an ashable hard mask layer (such as an amorphous carbon layer) and another suitable hard mask (such as an antireflective layer) may be deposited prior to applying the photoresist.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated may be performed in the sequence illustrated, in other sequences, in parallel, or in some cases omitted. Likewise, the order of the above described processes may be changed.

The subject matter of the present disclosure includes all novel and nonobvious combinations and sub-combinations of the various processes, systems and configurations, and other features, functions, acts, and/or properties disclosed herein, as well as any and all equivalents thereof.

What is claimed is:
1. A method of removing material from a substrate, comprising:
 (a) receiving a substrate having material for removal on a processing face of the substrate;
 (b) positioning and sealing the substrate in a substrate holder such that the processing face of the substrate is exposed;
 (c) positioning the substrate holder in a removal position, thereby forming a gap defined on one side by the processing face of the substrate, defined on the opposite side by a base plate, and defined around the edges by a flow distributor,
  wherein the gap has a dimension between about 2-10 mm as measured in a direction perpendicular to the processing face of the substrate
  wherein the flow distributor comprises:
   (i) an inlet side comprising an internal manifold spanning between about 90-180° of the flow distributor, wherein the internal manifold is a cavity in the flow distributor through which fluid may flow,
   (ii) one or more inlets for delivering fluid from one or more fluid supply lines to the internal manifold, and
   (iii) an outlet side comprising an outlet manifold spanning between about 90-180° of the flow distributor, wherein the inlet side and outlet side of the flow distributor are positioned on azimuthally opposed perimeter locations of the flow distributor;

(d) rotating the substrate in the substrate holder; and (e) flowing solution from the one or more inlets, through the internal manifold, into the gap and over the processing face of the substrate, and out through the outlet manifold, in that order, to thereby remove from the substrate at least some of the material for removal.

2. The method of claim 1, wherein sealing the substrate in the substrate holder forms a fluid tight seal between the substrate and the substrate holder.

3. The method of claim 1, further comprising: positioning the substrate holder in an open position such that the substrate may be removed from the substrate holder and removing the substrate.

4. The method of claim 1, wherein the material for removal comprises photoresist material.

5. The method of claim 4, wherein the photoresist material comprises negative photoresist material.

6. The method of claim 1, wherein the solution is flowed at a rate between about 20-40 LPM.

7. The method of claim 1, wherein the solution comprises a DMSO- and/or TMAH-based solution.

8. The method of claim 1, wherein the substrate has features thereon, and wherein the features have a principal dimension between about 5-120 μm.

9. The method of claim 1, wherein the material for removal is substantially completely removed within about 4 minutes after beginning to flow the solution over the face of the substrate.

10. The method of claim 1, wherein the base plate comprises a plurality of protuberances that extend into the gap.

11. The method of claim 10, wherein the protuberances are oriented parallel to one another and perpendicular to a direction of solution flow in the gap.

12. The method of claim 11, wherein each protuberance extends continuously across the base plate.

13. The method of claim 10, wherein the protuberances have a rectangular cross section.

14. The method of claim 10, wherein the protuberances are provided in varying shapes.

15. The method of claim 10, wherein the protuberances comprise holes through which solution can flow.

16. The method of claim 1, wherein the flow distributor comprises directional fins proximate the inlet side of the flow distributor, wherein the directional fins operate to redirect the flow of solution in the gap from (i) a radially inward flow, to (ii) a linear flow from the inlet side of the flow distributor to the outlet side of the flow distributor.

* * * * *